(12) United States Patent
Bonar et al.

(10) Patent No.: US 10,367,122 B2
(45) Date of Patent: Jul. 30, 2019

(54) INTEGRATED COLOUR LED MICRO-DISPLAY

(71) Applicant: Facebook Technologies, LLC, Menlo Park, CA (US)

(72) Inventors: James Ronald Bonar, Erskine (GB); Gareth John Valentine, York (GB); Stephen Warren Gorton, Edinburgh (GB)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 15/974,581

(22) Filed: May 8, 2018

(65) Prior Publication Data

US 2018/0261736 A1 Sep. 13, 2018

Related U.S. Application Data

(63) Continuation of application No. 15/526,279, filed as application No. PCT/GB2015/053496 on Nov. 18, 2015, now Pat. No. 10,008,645.

(30) Foreign Application Priority Data

Nov. 18, 2014 (GB) .................................. 1420452.3

(51) Int. Cl.
*H01L 33/50* (2010.01)
*H01L 33/52* (2010.01)
(Continued)

(52) U.S. Cl.
CPC .......... *H01L 33/507* (2013.01); *H01L 25/167* (2013.01); *H01L 27/156* (2013.01);
(Continued)

(58) Field of Classification Search
None
See application file for complete search history.

(56) References Cited

U.S. PATENT DOCUMENTS

| 5,661,371 A | 8/1997 | Salerno |
| 2005/0146258 A1* | 7/2005 | Weiss .................... B82Y 20/00 313/110 |

(Continued)

FOREIGN PATENT DOCUMENTS

| JP | 2010-40976 A | 2/2010 |
| JP | 2011-216668 A | 10/2011 |

(Continued)

OTHER PUBLICATIONS

Kim, Hyo-Jun, et al. "Optical Efficiency Enhancement in White Organic Light-Emitting Diode Display with High Color Gamut Using Patterned Quantum Dot Film and Long Pass Filter." Japanese Journal of Applied Physics, vol. 55, No. 8S3, 2016, doi:10.7567/jjap.55.08rf01. (Year: 2016).*

(Continued)

*Primary Examiner* — J. E. Schoenholtz
(74) *Attorney, Agent, or Firm* — Fenwick & West LLP

(57) ABSTRACT

There is herein described a low power consumption high brightness display. More particularly, there is described an integrated LED micro-display and a method of manufacturing the integrated LED micro-display.

20 Claims, 24 Drawing Sheets

(51) Int. Cl.
*H01L 25/16* (2006.01)
*H01L 33/00* (2010.01)
*H01L 33/22* (2010.01)
*H01L 33/60* (2010.01)
*H01L 27/15* (2006.01)
*H01L 33/58* (2010.01)
*H01L 33/32* (2010.01)
*H01L 33/62* (2010.01)

(52) U.S. Cl.
CPC .......... *H01L 33/0079* (2013.01); *H01L 33/22* (2013.01); *H01L 33/32* (2013.01); *H01L 33/58* (2013.01); *H01L 33/60* (2013.01); *H01L 33/62* (2013.01); *H01L 33/505* (2013.01); *H01L 2924/0002* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 2011/0299044 A1* | 12/2011 | Yeh | H04N 9/315 353/52 |
| 2011/0303893 A1 | 12/2011 | Wagner | |
| 2012/0223875 A1* | 9/2012 | Lau | H01L 27/156 345/83 |
| 2014/0111408 A1 | 4/2014 | Lau | |
| 2015/0228865 A1* | 8/2015 | Rhee | H01L 27/156 257/90 |

FOREIGN PATENT DOCUMENTS

| | | |
|---|---|---|
| JP | 2010-87224 | 11/2011 |
| JP | 2013-011803 A | 1/2013 |
| JP | 2014-160835 A | 9/2014 |
| KR | 10-2009-0024191 A | 3/2009 |
| KR | 1020140030887 A | 3/2014 |
| WO | WO 2014/030830 A1 | 2/2014 |
| WO | WO 2014/099499 A1 | 6/2014 |
| WO | WO 2014/006987 A1 | 6/2016 |

OTHER PUBLICATIONS

Choi, H. W. et al., "GaN Micro-Light-Emitting Diode Arrays with Monolithically Integrated Sapphire Microlenses," Applied Physics Letters, American Institute of Physics, vol. 84, No. 13, Mar. 29, 2004, pp. 2253-2255.

PCT International Search Report and Written Opinion, PCT/GB2015/053496, dated Jan. 20, 2016, 10 pages.

United States Office Action, U.S. Appl. No. 15/526,279, dated Nov. 2, 2017, 15 pages.

Japanese Office Action, Japanese Application No. 2017-526124, dated Aug. 21, 2018, 7 pages.

Korean Office Action, Korean Application No. 10-2017-7015032, dated Oct. 23, 2018, 13 pages.

* cited by examiner

Step 1

(1) Silicon Dioxide
(2) Ohmic Current Spreading Layer
(3) GaN Layer
(4) Substrate : Sapphire, Silicon or Silicon Carbide (curved line denotes significantly thicker than other layers)

Option : Etched Pixel

Step 2

(5) GaN etched

Option : Etched Pixel

Step 3

(6) Silicon dioxide and ohmic layer etched to define pixels

Step 4

(7) Plasma treatment to create conductive and insulating regions

Step 5

(8) Remove and deposit layer of silicon dioxide

Step 6

(9) Deposit metal layer (n contact)
(10) Etch silicone dioxide to create contact to pixels Step 7

(11) Deposit bond pads (n and p contacts)

Step 8

(12) Remove LED substrate (Laser lift off for silicone, chemical mechanical polishing and etch for silicone)
(13) Bond to temporary wafer-curved line indicates significantly thicker than GaN layer Step 9

(14) Etch GaN to form optical features (lenses)

Step 9 Option : Roughened GaN

(15) GaN surface roughened to improve light extraction

Step 10

(17) Etch via through GaN to etch stop on n contact

Step 10 Option : Use n contact etch stop to control lens thickness

(18) End point detection used during lens etch to simultaneously open via through to n contact and provide control of lens thickness Step 11

(19) Deposit conductive metal grid and/or opaque layer

Step 11 Option : ITO conductive layer

(20) ITO may be deposited instead of metal to create a transparent conductive layer. Selection of the appropriate ITO thickness may result in an antireflection function Step 12

(22) SiO2 or other single or multilayer coating may be deposited over the surface of the GaN lens and the n metal. This provides both protection and anti-reflection purposes.

Step 12 Option :Patterned SiO2

(23) The dielectric coating may be patterned such that only the GaN lens (or roughened surface) is covered Step 12 Option : Short Pass Filter (e.g. Multilayer Dielectric Coating)

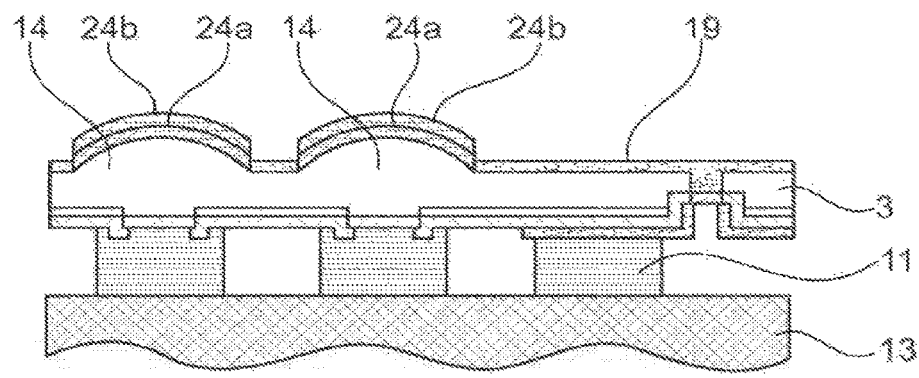

(24) Different or additional coatings or layers may be applied or deposited to provide a short pass wavelength filter function. This may be patterned to cover the lenses only or it may cover the full surface. The short pass filter is designed to allow blue light to exit the GaN, but reflect longer wavelengths (i.e. red or green light generated by the colour conversion layer)

Fig. 22

Step 13

(25) Colour conversion layer - e.g. phosphor, quantum dot, organic substance or combination

(26) Substrate - glass, sapphire, silicon or other

(27) Transparent layer to allow blue light to exit - may also provide diffusing or scattering function

(28) Opaque/black mask or reflective mask

Step 13 Option : Silicon Substrate

(29) Etched silicon substrate

Step 13 Option : Short pass filter

(30) Short pass filter layer to allow
blue light to enter, but reflect
longer converted light such as
green and red

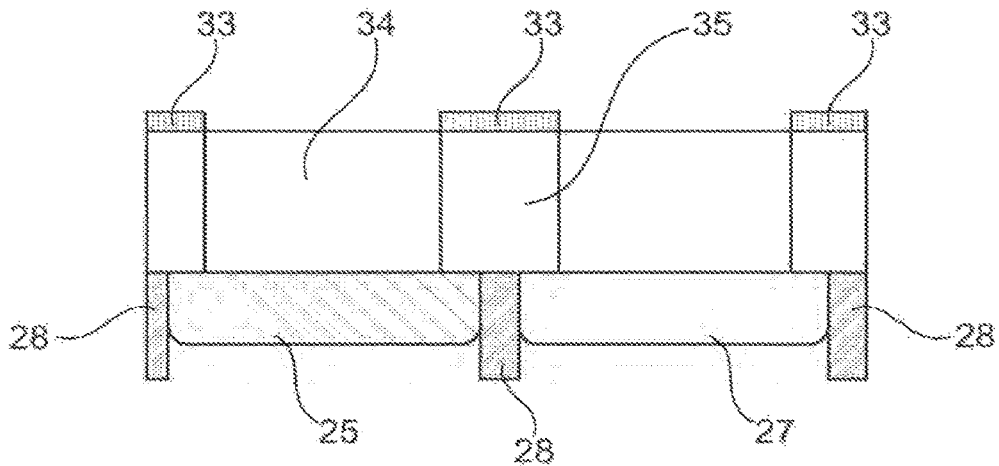

Step 13 Option : Waveguide

(33) Opaque/reflective features
(34) Modified refractive index of transparent layer to provide optical waveguiding function
(35) Un-modified refractive index

Fig. 26

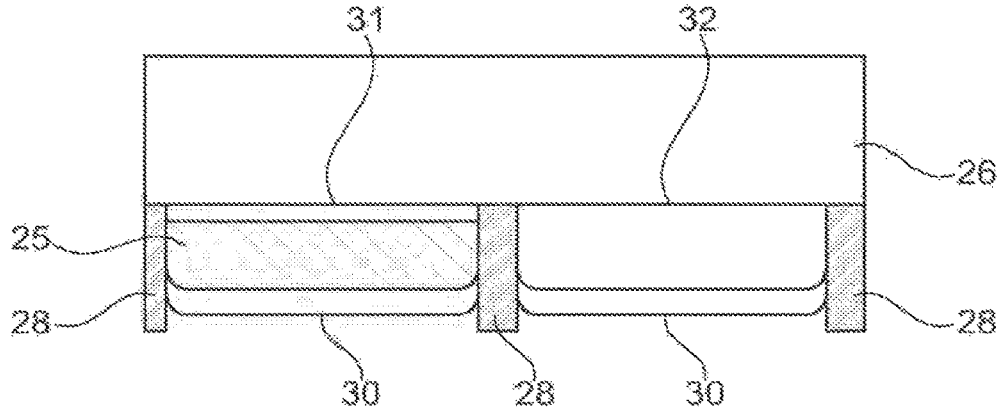

Step 13 Option : Long Pass Filter

(31) Long pass filter positioned beneath the colour conversion layer - allowing converted light to exit, but recycling blue unconverted light

(32) A long pass filter would not be deposited over blue pixels to allow transmission of blue light

Fig. 27

(36) Align colour conversion Layer to LED Layer

(38) Remove temporary layer

(39) Align and bond electronic drive layer (CMOS, TFT or other)

(43) Various pixel layout implementations may be used. In this instance three sub-pixels are arranged in each 20x20 micron pixel cells

(45) Bond pads may be positioned away from the pixel

(44) In this alternative layout four sub-pixels are included in each pixel

(46) Bond pads may be positioned over the pixel

(47) Red colour conversion cell
(48) Green colour conversion cell
(49) Blue pixel without colour conversion cell (may include transparent/diffusing layer)

(50) Opaque/reflecting matrix

INTEGRATED COLOUR LED MICRO-DISPLAY

CROSS REFERENCE TO RELATED APPLICATIONS

This application is a continuation of U.S. application Ser. No. 15/526, 279, filed May 11, 2017, which is a National Phase application of International Application No. PCT/GB2015/053496, filed Nov. 18, 2015, which claims the benefit of United Kingdom Application No. GB1420452.3, filed Nov. 18, 2014, which are incorporated herein by reference in their entirety.

FIELD OF THE INVENTION

The present invention related to a low power consumption high brightness display. More particularly, the present invention related to an integrated colour LED micro-display and a method of manufacturing the integrated colour LED micro-display.

BACKGROUND OF THE INVENTION

Although there are many colour micro-displays many of the prior art colour micro-displays have a number of disadvantages.

There is extensive literature reporting the development of micro-displays using technologies such as OLED, Liquid Crystal and MEMS. The latter two are based on pattern generators located externally to a light source that is permanently on full brightness, and consequently require extra components to form the micro-display. A further basic drawback then related to the power loss as all pixels must be addressed with light even if they are not used to display the image. The contrast ratio of such displays is also compromised.

OLED technology is an emissive technology and in simple terms is based on an anode and cathode surrounding a fluorescent emitting layer. These techniques often use white light with colour filters for small pixel formation. Consequently, approximately 60 to 70% of the spectral range of the white pixels are lost/not needed to achieve the colour gamut in a RGB display. In addition, white OLEDs are in themselves less efficient than monochrome OLEDs, such that in the end only 10 to 20% of the emitted light can actually be used. This does not take into account for the efficiencies of the overall OLED structure or how the light is extracted.

Moreover, the OLED structure is also more complex and involves electron transport layer, hole blocking layer and electron blocking layer all carefully controlled in thickness and refractive index. This is important for improved display performance as the electrically doped electron and hole transport layers enable enhanced charge injection and low operating voltages. The charge blocking layers help to confine charge carriers within the emission layer. Furthermore, other issues relate to the poor efficiencies and limited lifetimes in the blue OLED wavelength region and coupled with the low brightness levels mean that the display has fundamental limitations in performance.

Techniques do exist to provide surface mount bonding in individual LEDs. Typically, pick and place techniques can only be used for large LEDs. Thus limiting the pixels per inch for a display. It also means that there is the need for two electrical contacts per pixel. For the former point, techniques have been developed to pick and place micro-LEDs. However, to provide electrical contacts presents challenges for small pixel with post-processing required.

Disadvantages of such systems can be summarised by the following:

Manufacturing—time per flip-chip bond, simultaneous n and p connection for each pixel and ability to place pixels with <10 µm dimensions;

Post processing of pick and place micro-LEDs using semiconductor processing techniques. The provision of conformed contact layers across the LED arrays to form a secondary global contact. Or a combination of planarization techniques to provide a planarised structure on which a patterned contact layer is formed. The need to provide transparent contact layers for light escape or subsequent patterning of contact layers to enable this. The need to provide electrical connection to the control backplane.

Performance—in particular selection of green LED devices with small chromatic variation over drive current and temperature. Requirement to have each green LED emission wavelength in a tight distribution due to the eye's sensitivity to small variations in wavelengths near the peak of its visual response (i.e. green).

It is an object of at least one aspect of the present invention to obviate or mitigate at least one or more of the aforementioned problems.

It is a further object of at least one aspect of the present invention to provide a low power consumption high brightness display and a method of manufacturing said display.

SUMMARY OF THE INVENTION

According to a first aspect of the present invention there is provided a method of fabricating an integrated LED micro-display comprising:

providing a colour converter capable of changing the wavelength of light;

providing an array of micro-LEDs connected to the colour converter and which is capable of forming electrical connections and pumping light into the colour converter; and providing a backplane control in the form of an electronic drive layer;

wherein the micro-LED array generates pumped light at a shorter wavelength than emitted light from the colour converter thereby producing light at a longer wavelength.

The process of manufacturing involves a number of different stages which are set out below. It should also be apparent that in various embodiments description is made with reference to figures. However, certain embodiments may be practiced without one or more of these specific details, or in combination with other known methods and configurations.

First of all, there may be provided a GaN layer comprising p and n doped GaN regions and layers optimized for efficient light generation on top of which there is an ohmic current spreading layer and a layer of silicon dioxide. Located below the GaN layer there may be a substrate layer which is significantly thicker than the other layers. The ohmic current spreading layer may have a thickness of 20 nm. The layer of silicon dioxide may have a thickness of about 200 nm. The substrate layer may have a thickness of about 200 µm. The substrate layer may be any suitable material such as sapphire, silicon, GaN or silicon carbide. Example materials for the ohmic current spreading layer may be Ni/Au or Ni/Pt or Au/Pt or Pt/Ni/Au Ni/Ag or Pd or ITO or Ni/ITO.

The process may start with selective deactivation of p-GaN to form a pixel or an array of pixels. This can be described as follows:

- a first spreading layer is deposited on top of a GaN p layer e.g. Ni/Au
- a patterned mask feature (e.g. photoresist) is then deposited on the spreading layer
- said structure is then exposed to a plasma such as Ar to remove the spreading followed by $Cl_2$ to etch down ~1 um to the n-GaN (this process may be at a later stage in the process)
- a patterned mask feature (e.g., photoresist) is then deposited for pixel definition
- then exposing the layered structure to an etch (plasma or dry) to remove the first spreading layer from the areas not protected by the mask e.g. Ar
- said structure is then exposed to a plasma such as $CHF_3$
- the removal of a patterned feature may then be performed
- then annealing of the structure to form highly resistive layers in the areas exposed to plasma, whilst retaining conductive e.g. ohmic contract at the layers protected by the mask to form a pixel or an array of pixels Alternatively, the process may start with a pixel or an array of pixel formation using physical etching of the p-GaN. This can be described as follows:

- a first spreading layer is deposited on top of a GaN p layer e.g. Ni/Au
- a patterned mask feature (e.g. photoresist) is then deposited on the spreading layer
- said structure is then exposed to a plasma such as Cl2 to etch down ~1 um to the n-GaN to leave pixels
- the removal of the patterned feature may then be performed
- then annealing of the structure to form conductive e.g. ohmic contact at the a pixel or an array of pixels The layer of silicon dioxide on the top of the pixels may then be removed and then re-deposited in the form of a complete layer of silicon dioxide. The complete layer of silicon dioxide may have a thickness of about 200 nm and may be deposited using any suitable technique such as PECVD.

The area of the complete layer of silicon dioxide above the pixels may then be etched away to form windows to the ohmic current spreading layer and a window where the common contact is to be formed. In this embodiment this is the common n contact region. For the deactivation process the silicon dioxide must be formed on the sidewall to provide passivation. For the physical etched pixel or pixel array the passivation of the sidewall is required where the n-contact region is etched locally. In addition, an n contact metal layer may be deposited in the area of the etch. The n contact metal may be Ti/Au and may have a thickness of about 50/250 nm. The n contact metal layer may form a global contact and has an electrical function and/or functions as a guide for controlling a further etch step (an etch stop) in the manufacturing process.

Bond pads may then be deposited to form n and p contacts. The bond pads may have a height of about 2 μm and a cross-section of about 8 μm×8 μm. It is the intention to have the p and n bond pads of the same height. Furthermore, the bond pads can be formed on a masking layer such that the metal is deposited everywhere. This then this provide a means for chemical polishing of the device to provide a flat top layer with the metal and dielectric planar. Such a top structure then provide the means for uniform bonding (p and n bond pad stacks) at the same height. Consequently, a range of bonding techniques can be utilized for GaN to backplane control (CMOS, TFT or NMOS layer) including but not limited to flip-chip bump bonding and direct bonding based on Van der Waal's forces. The latter is of particular interest as it permits bonding at low temperatures and with very little bond force. As the LED array size increases, the total bond force required becomes an important characteristic and can result in a physical limitation on array size. Also because of the low temperature bond. TFT backplane structures can be used which are similar in nature to Active Matrix OLED (AMOLED) control backplanes. This reduces the cost, complexity and provides a route to displays with larger physical dimensions.

A temporary wafer made from Silicon may be bonded to the GaN wafer. The temporary wafer may have a thickness of about 500 μm and is significantly thicker than the GaN layer.

The substrate layer may then be removed off with any suitable technique such as laser lift-off. In the event that the substrate layer is silicon, chemical mechanical polishing and etching or a combination of the techniques is possible. This has the added capability of forming micron features in the silicon substrate which can be used in the overall design.

The buffer or n-GaN layer may then be etched to form optical features which in the preferred embodiments may be in the form of micro-lenses. The optical features may be convex in shape to maximize emission and minimise optical crosstalk between pixels. The optical features may have a width of about 8 μm.

In an alternative, the etching process may form roughened areas in proximity to the pixel. The roughened areas of 1 μm in depth may be used to improve light extraction.

In a further alternative there may be a matrix etching process where GaN pillars may be formed. The GaN pillars may have a height of about 2 μm. The GaN pillars are also preferably truncated in shape to maximize optical isolation between LED pixel output to reduce optical crosstalk.

The n-side etch process may be accurately controlled by etching to the n contact metal layer on the other side of the wafer to provide a suitable etch stop. By using real time plasma monitoring technique such as end point detection the etching depth can be accurately controlled in respect to the position of the GaN quantum well.

In a further alternative the n contact layer may be used as an etch stop to control the lens thickness. The end point detection may be used during the lens etch to simultaneously open through to the n contact metal layer and provide control of the lens thickness.

There may then be a deposition step where there may be a deposition of conductive metal grid and/or opaque layer. The conductive metal grid and/or opaque layer may reduce n-contact resistance hence and has a shielding effect. The metal grid and/or opaque layer may have a thickness of about 200 nm and may be deposited using any suitable technique.

In an alternative an ITO conductive layer may be deposited instead of metal to create a transparent conductive layer. The selection of the appropriate ITO thickness may result in an anti-reflection coating to increase light transmission.

In a further alternative if GaN pillars are formed then they may be coated with a layer of a metal to cover the sidewalls to minimize crosstalk. The layer of n metal may have a thickness of about 200 nm.

A layer of $SiO_2$ or any other suitable type of single or multi-layer coating may also be deposited over the surface of the GaN lens and the n metal layer. This provides both protection and an anti-reflection function of the GaN surface as it reduces Fresnel reflection. The coating may have a thickness of about 80 nm.

In a further alternative only the curved area of the optical features, or roughened areas may be covered with a dielectric coating. The dielectric coating may be made from silicon dioxide and may have a thickness of about 80 nm.

In a further alternative coatings may be deposited. There may therefore be multi-layer dielectric coatings. There may simply be one coating or additional coatings or layers which have the function of providing a short pass wavelength filter function. The coatings may be patterned to cover the optical features only or it may cover the full surface. The short pass filter may be designed to allow blue light to exit the GaN but reflect longer wavelengths (i.e. the red or green light generated by the colour conversion layer).

The process also requires use of a colour converter which in some embodiments can have high reflectivity layers adjacent to sub-pixels to improve colour conversion efficiency and display contrast. The colour converter comprises a colour conversion layer, a substrate, a transparent layer and a mask. The colour conversion layer may be made from phosphor, quantum dot, organic substance or a combination thereof. The colour conversion layer may have a thickness of about 1-20 μm or preferably about 1-10 μm. The substrate may be made from glass, sapphire, silicon or any other suitable material. If blue light is used to optically pump the colour converter then it is not necessary to convert the incident light for the blue sub-pixel of the display. Consequently there may be no material in the blue cell or a transparent layer which may be made from silicon and allows blue light to exit or alternatively may provide a diffusing or scattering function to provide a similar beam profile as the red and green phosphors. The mask may be opaque/black matrix resin (commonly used in LCD displays) or reflective and may be made from Au, Al or Ag.

In an alternative colour converter there may be an etched silicon substrate. The colour converter may compromise a colour conversion layer, a transparent layer and an etched silicon area.

In an alternative colour converter there may be a short pass filter which allows blue light to enter, but reflects longer converted light such as green and red.

In a further alternative there may be a colour converter which can be described as operating like a waveguide. As before there is a colour conversion layer, transparent layer and a mask. In addition there are opaque/reflective features, a modified refractive index transparent layer which provides an optical waveguiding function and an un-modified refractive index layer.

In a further alternative there is a colour converter which can be described as a long pass filter. The colour converter may have a long pass filter located below the colour conversion layer. The long pass filter may allow converted light to exit, but recycles blur unconverted light.

In the next step in the process the colour converter is brought up to and aligned with the LED layer.

The colour converter may then be attached to the rest of the device. In a preferred embodiment the colour converter may be pumped with blue light and there is a red/green colour conversion layer which is the phosphor layer. Alternatively, the layer may be a quantum dot or transparent/diffusing layer (blue) or a mixture thereof. Extending vertically down from the glass substrate there may be an opaque/black mask or reflective masks. The reflective mask may be preferred as this has the ability to recirculate the light, minimises crosstalk and enhances display contrast.

The reflective mask therefore has the ability to transmit blue light and reflect red and green light when a filter is placed before the transmittive layer. In an alternative, if the filter is placed after the transmittive layer then the blue light will be recirculate and the red and green transmitted.

In the next stage in the process the temporary layer may be removed.

The electronic drive layer may then be brought up to and aligned and attached to the metal bond pads on the LED. The bonding layer stack may include a low temperature solder material such as tin or indium, or alloys thereof. The planarity of the GaN p-layer also provides the capability to use low temperature direct bonding, including van der Waals forces, hydrogen bonds and strong covalent bonds. The electronic drive layer may be a CMOS, TFT or NMOS NMOS layer. In particular, the ability to use direct bonding techniques permits the ability to adapt thin film transistor techniques employed in matrix organic light emitting diode (AMOLED) micro-displays.

The integrated colour LED micro-display may have a pixel layout implementation. In one embodiment, three sub-pixels may be arranged in a 20×20 micron cell with the bond pads being positioned away from the pixels.

In an alternative embodiment, the pixel layout implementation may comprise four sub-pixels included in each pixel with the bond pads positioned over the pixels.

The integrated colour LED micro-display may comprise a red colour conversion cell, a green colour conversion layer and a blue pixel without colour conversion cell (which may include a transparent/diffusing layer).

In an alternative integrated colour LED micro-display there may be an opaque/reflecting matrix.

In an alternative integrated colour LED micro-display there may be a matrix of red colour conversion cells, green colour conversion cells and blue pixels without colour conversion cells.

In a yet further alternative integrated colour LED micro-display there may be a matrix of red colour conversion cells, green colour conversion cells, blue pixels without colour conversion cells and an opaque/reflective matrix.

According to a second aspect of the present invention there is an integrated colour LED micro-display comprising:

a colour converter capable of changing the wavelength of light;

an LED connected to the colour converter and which is capable of forming electrical connections and pumping light into the colour converter; and a back plate control in the form of an electronic drive layer;

wherein the LED pumps light at a shorter wavelength than emitted light from the colour converter thereby producing light at a longer wavelength.

Generally speaking, the present invention therefore resides in the provision of an integrated colour LED micro-display which provides a low power consumption high brightness display.

The integrated colour LED micro-display may be formed as defined in the first aspect.

The colour converter may comprise a colour conversion layer, a substrate, a transparent layer and a mask. The colour conversion layer may be made from phosphor, quantum dot, organic substance or a combination thereof. The colour conversion layer may have a thickness of about 5-20 μm or preferably about 10-12 μm. The substrate may be made from glass, sapphire, silicon or any other suitable material. The transparent layer may allow blue light to exit or alternatively may provide a diffusing or scattering function. The mask may be opaque/black or reflective.

The LED may comprise optical features which are in the form of lenses. The optical features may be convex in shape and maximize emission and minimise spectral crosstalk.

The LED may also comprise a musk which may be opaque/black or reflective and may be made from metal such as Al or resin/polymer.

The LED may also comprise bond pads which are deposited to form n and p contacts The bond pads may have a height of about 2 μm and a cross-section of about 8 μm×8 μm.

The backplane control may comprise an electronic drive layer which has bond pads. The electronic drive layer may be a CMOS, TFT or NMOS layer.

The bond pads on the backplane control are attached to bond pads on the LED.

BRIEF DESCRIPTION OF THE DRAWINGS

Embodiments of the present invention will now be described, by way of example only, with reference to the accompanying drawings in which:

FIG. 22 represents is a further alternative where coatings are deposited to have the function of providing a short pass wavelength filter function according to an embodiment of the present invention;

FIG. 26 represents a further alternative colour converter which can be described as operating like a waveguide according to an embodiment of the present invention;

FIG. 27 represents a further alternative colour converter which can be described as a long pass filter according to an embodiment of the present invention;

BRIEF DESCRIPTION

Generally speaking, the present invention resides in the provision of a low power consumption high brightness display.

FIGS. 1 to 41 show the process of making a micro-display according to the present invention. This is discussed below.

Figure 1:
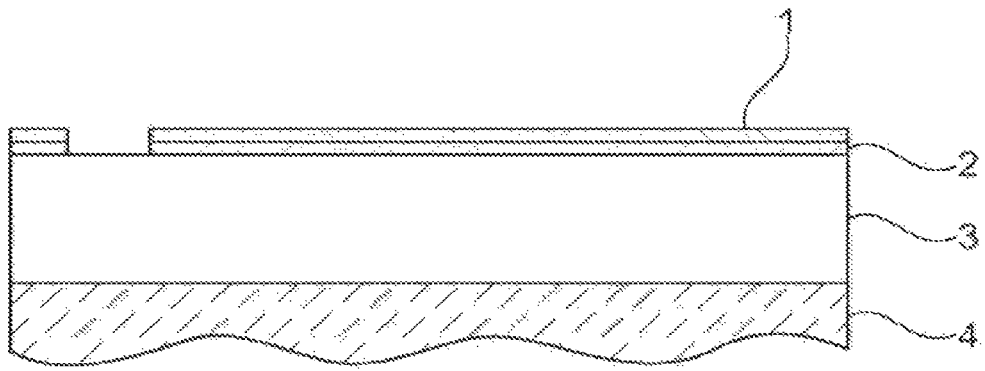
FIG. 1 represents a GaN layer on top of which there is an ohmic current spreading layer and a layer of silicon dioxide and below there is a sapphire substrate layer according to an embodiment of the present invention.

FIG. 1 shows a light emitting GaN layer 3 on top of which there is an ohmic current spreading layer 2 and a layer of silicon dioxide 1. Located below the GaN layer 3 there is a substrate layer 4 which is significantly thicker than the other layers. The ohmic current spreading layer 2 has a thickness of about 20 nm. The layer of silicon dioxide 1 has a thickness of about 200 nm. The substrate layer 4 has a thickness of about 200 nm. The substrate layer 4 can be any suitable material such as sapphire, silicon, GaN and silicon carbide. Example materials for the ohmic current spreading layer 2 are Ni/Au or Ni/Pt or Au/Pt or Pt/Ni/Au Ni/Ag or Pd or ITO or Ni/ITO.

Figure 2:
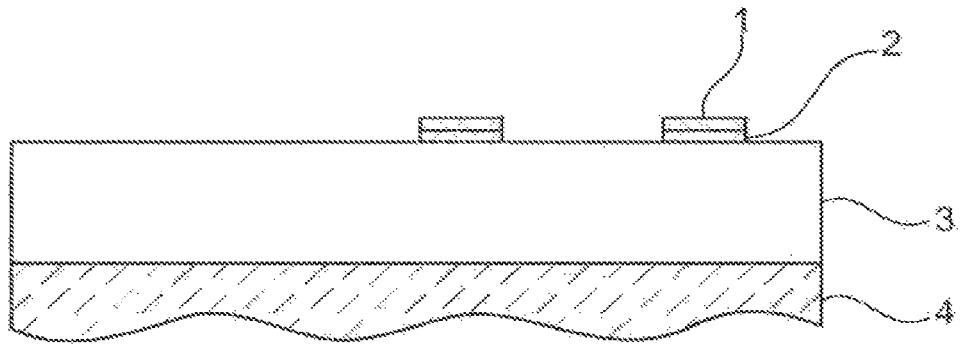
FIG. 2 represents an alternative processing method where a GaN layer has etched pixels comprising a layer of silicon dioxide and ohmic current spreading layer according to an embodiment of the present invention.

FIG. 2 represents an alternative process method where the GaN layer 3 has etched pixels comprising a layer of silicon dioxide 1 and ohmic current spreading layer 2. This is a standard technique to form the LED pixel. In FIG. 2 the spreading layer 2 is defined, typically to be the same size as the final pixel dimension.

Figure 3:
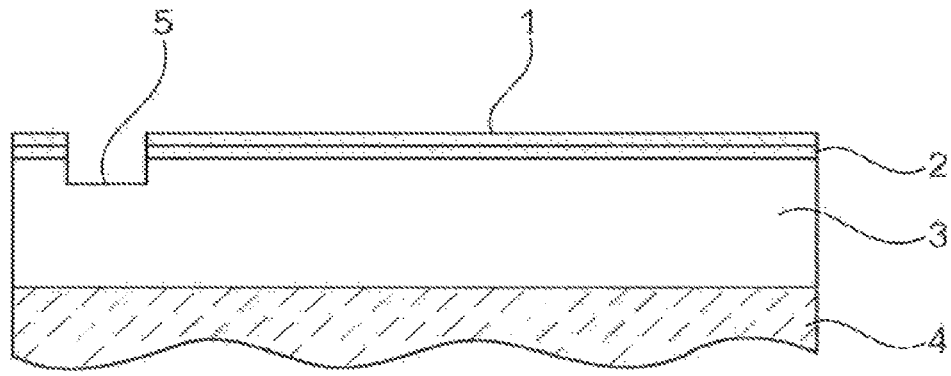
FIG. 3 represents an etching process performed on the device shown in FIG. 1 according to an embodiment of the present invention.

In FIG. 3 an etching process is performed on the device shown in FIG. 1 which is a GaN modification process. The etching produces an etched area 5 where the GaN layer 3 is etched. The etching process is performed using any suitable etching process but is preferably performed by plasma etching using $CF_3$ but other techniques such as wet etching may be used. Etching down to the n material may be performed using plasma etching using Cl.

Figure 4:
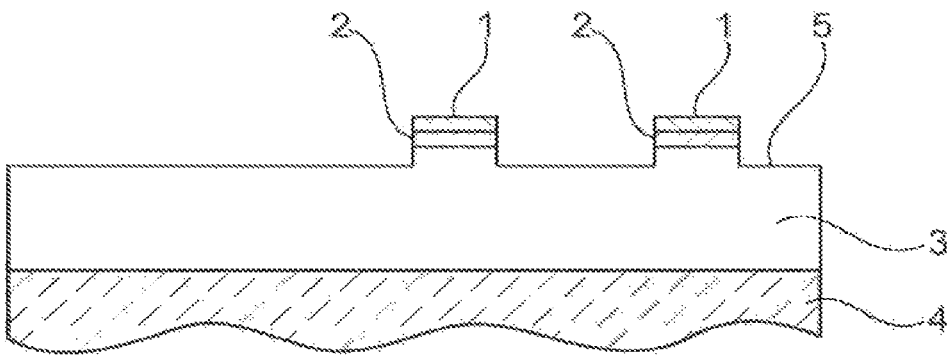
FIG. 4 represents an alternative device to that shown in FIG. 2 which is etched in the GaN layer around pixels to form an etched area according to an embodiment of the present invention.

In FIG. 4 the alternative device shown in FIG. 2 is etched in the GaN layer 3 around the pixels to form an etched area 5.

Figure 5:
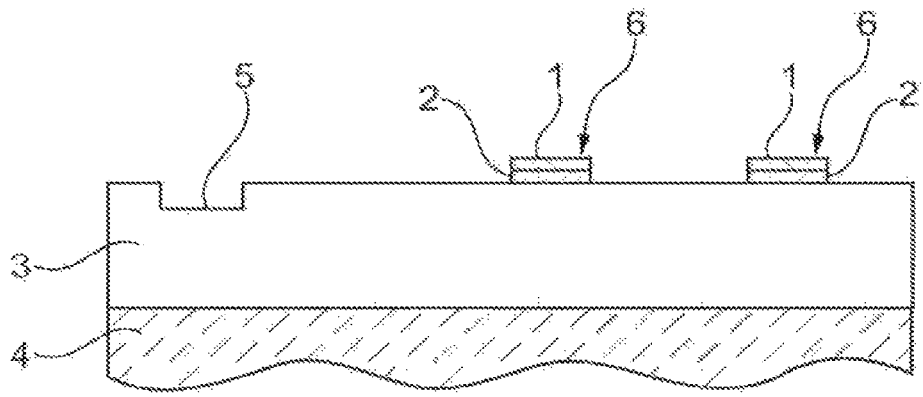
FIG. 5 represents a further etching process where the ohmic current spreading layer and the layer of silicon dioxide are etched away to form pixels according to an embodiment of the present invention.

As shown in FIG. 5 a mask is then applied so as to enable pixel formation. There is a further etching process where the ohmic current spreading layer 2 and the layer of silicon dioxide 1 are etched away to form pixels 6. The etching process is performed using any suitable plasma etching process such as $CHF_3$. The pixels 6 can be formed in a matrix pattern. This leaves pixels with dimensions of between 0.5 μm and 100 μm. A typical dimension is about 3 μm.

Figure 6:
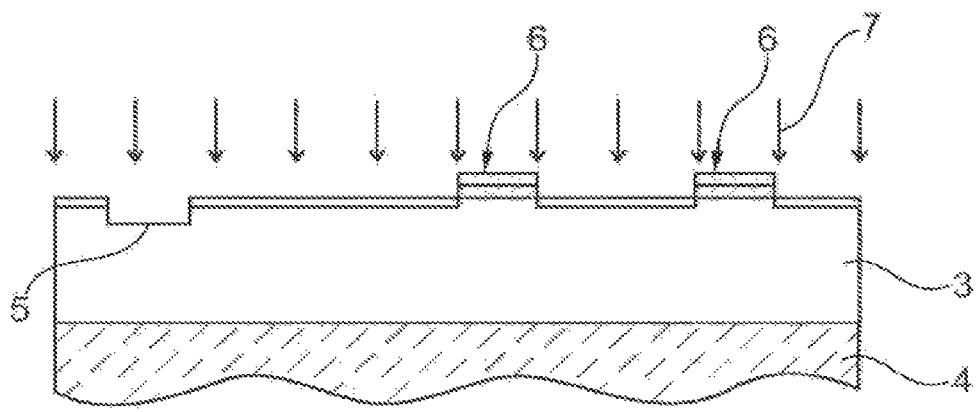
FIG. 6 represents a plasma treatment which is used to create conductive and insulating regions according to an embodiment of the present invention.

In the process step shown in FIG. 6, there is a plasma treatment 7 which is used to create conductive and insulating regions. The unprotected GaN is exposed to a GaN modification process e.g. a plasma such as $CHF_3$. The removal of the patterned feature may then be performed followed by annealing of the structure to form highly resistive layers in the areas exposed to plasma, whilst retaining conductive e.g. ohmic contact at the layers protected by the mask to form a pixel or an array of pixels.

Figure 7:
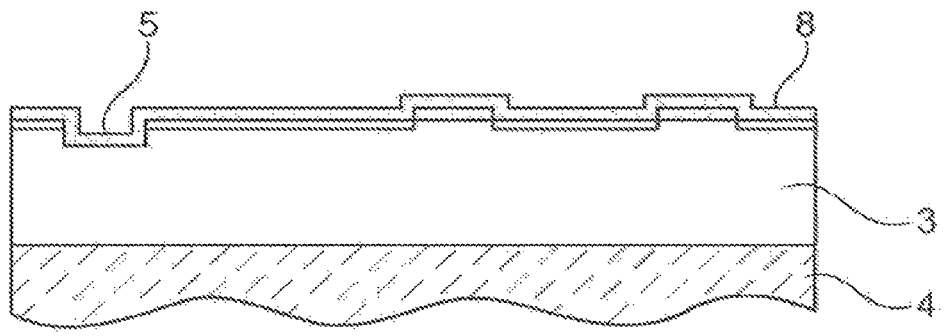
FIG. 7 represents the layer of silicon dioxide on the top of the pixels being removed and then re-deposited in the form of a complete layer of silicon dioxide according to an embodiment of the present invention.

In FIG. 7 a mask layer is formed. The layer of silicon dioxide 1 on the top of the pixels 6 is removed and then re-deposited in the form of a complete layer 8 of a photo-resist only or a dielectric e.g. $SiO_2$ with photoresist on top to pattern the $SiO_2$ layer.

Figure 8:
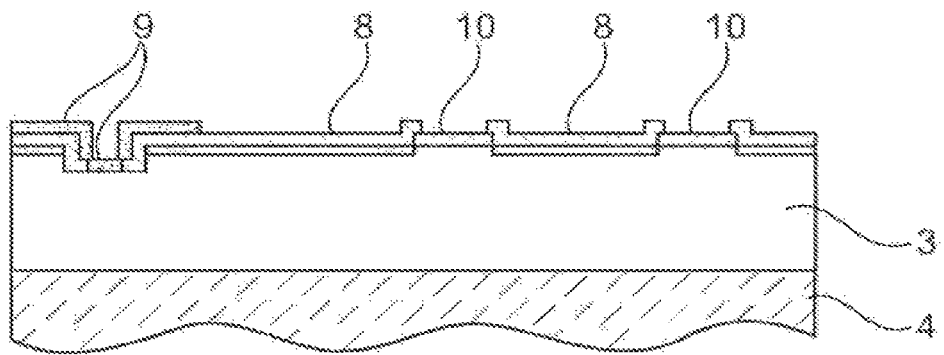
FIG. 8 represents the area of the complete layer of silicon dioxide above the pixels being etched away to form contact windows according to an embodiment of the present invention.

In FIG. 8, the mask is then opened above the n-contact area and the spreading material. A conductive contact is then deposited e.g. Ti:Au or other combinations. It should be apparent that the etch sidewall at the n-contact area has an electrical insulating layer on the sidewalls to prevent shorting across the p-n junction. The area of the complete layer 8 of silicon dioxide above the pixels 6 is etched away to form contact windows 10 to the ohmic current spreading layer 2 below to create contact. In addition, an n contact metal layer 9 is deposited in the area of the etch 5. The n contact metal layer 9 forms a global contact and has an electrical function and/or functions as a guide for controlling a further etch step in the manufacturing process.

Figure 9:
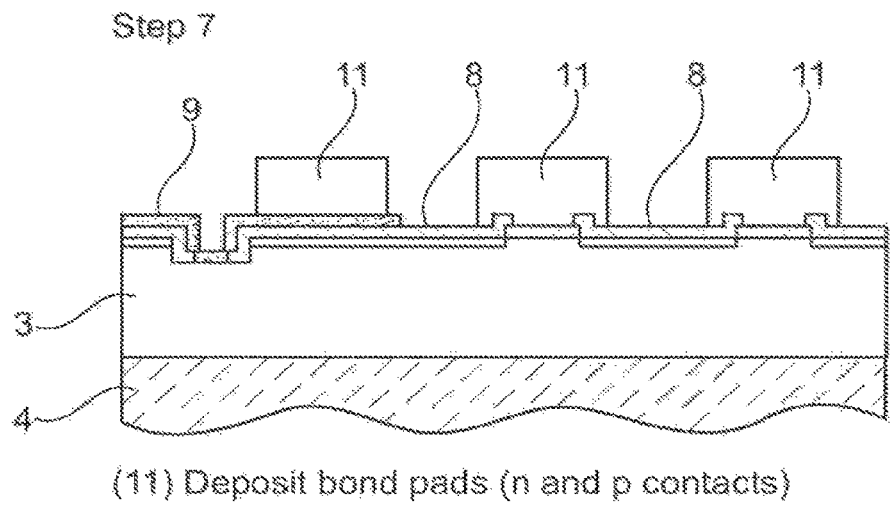
FIG. 9 represents bond pads deposited to form n and p contacts according to an embodiment of the present invention.

In FIG. 9, bond pads 11 are deposited to form n and p contacts. This may use the same masking layer or alternatively a new mask. The p and n bond pad have the advantage of having the same height and thus improve the bonding probability of success for an array of LEDs. The n-pad etch depth can be used as both an accurate etch stop for the process later on i.e. when etching from the GaN side, exposed after laser lift off, and as a means to provide a connection for a distributed electrical contact on the backside of the wafer. Furthermore, the mask layer for forming the bond pad metal can provide a layer without topology and as such a process such as CMP—chemical mechanical polishing (damscene) can be used to planarise the metal to the top of the mask layer. This polishing process then enables the ability to have a flat bonding surface. Consequently, it will be possible to use a range of bonding processes including but not limited to flip-chip bump bonding (thermo-sonic or thermo-compression), or direct bonding or any other technique to form a mechanical and electrical bond to a backplane, e.g. CMOS, TFT or NMOS layer.

Figure 10:
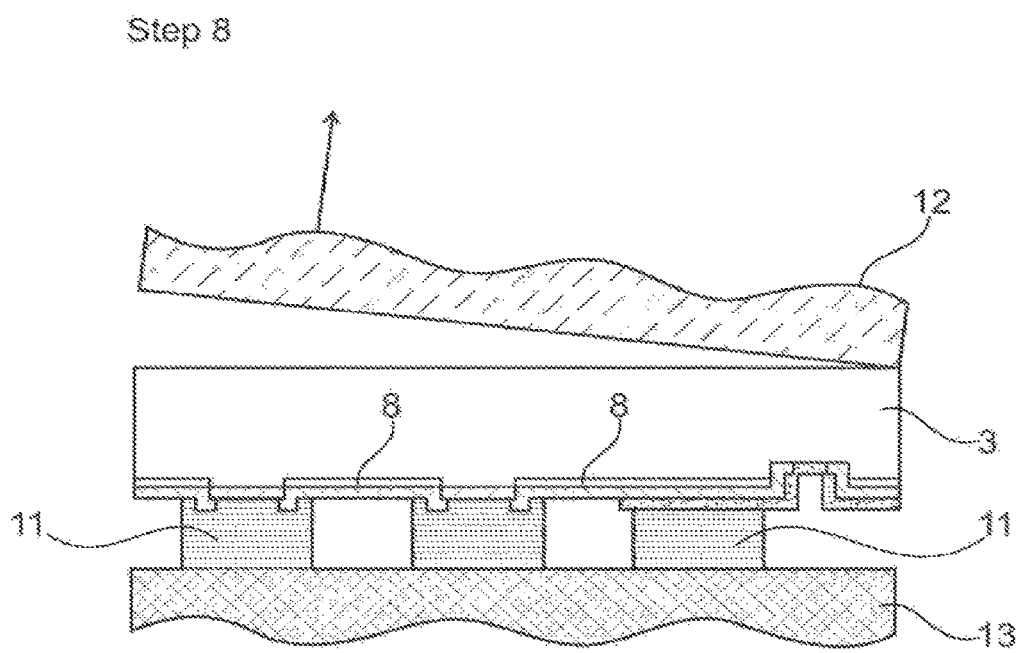
FIG. 10 represents the substrate layer being removed according to an embodiment of the present invention.

As shown in FIG. 10, the substrate layer 4 is removed off with any suitable technique such as laser lift-off. The substrate layer 4 can then undergo silicon, chemical mechanical polishing and etching for the silicone. The GaN on substrate (sapphire, etc.) is then bonded to a temporary wafer with the GaN surface in contact to this layer. Industry standard techniques may be used to detach the GaN layer from the substrate. In this particular example laser lift off is used. Alternatively, CMP can be used to remove silicon of GaN. This can then be combined with etching of the substrate so that features can be etched into the substrate. As is shown later (FIG. 13) pillars can be left from the Si to provide isolation between sub-pixels. The temporary wafer 13 has a thickness which is significantly thicker than the GaN layer 3.

Figure 11:
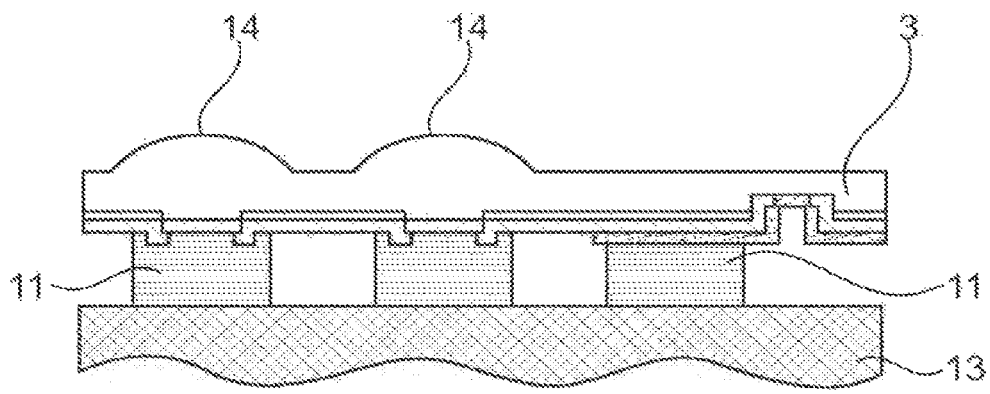
FIG. 11 represents the GaN layer being etched to form optical features according to an embodiment of the present invention.

In FIG. 11, now the GaN layer is exposed on the backside a range of features can be formed in this structure. This can be to provide the means of extracting more light and/or providing features to reduce optical cross-talk between sub-pixels. The GaN layer 3 is etched to form optical features 14 which are in the form of lenses. The optical features 14 are convex in shape and maximize emission spectral crosstalk. It is also possible to deposit a layer on these features such as $SiO_2$ to act as an anti-reflection coating. In this particular feature, lenses are formed (the height can be accurately determined by using the etch stop) to increase light extraction and to reduce optical crosstalk between sub-pixels.

Figure 12:
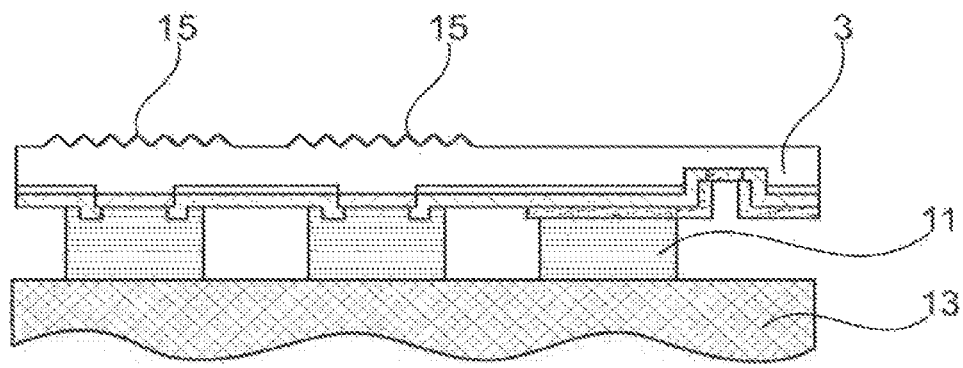
FIG. 12 represents an alternative etching method to form roughened areas according to an embodiment of the present invention.

As shown in FIG. 12, in an alternative the etching may be used to form roughened areas 15. The roughened areas 15 may be used to improve light extraction. In this case a scattering surface is formed from etching. Like FIG. 11 a layer or layers can be deposited to reduce the Fresnel reflections.

Figure 13:
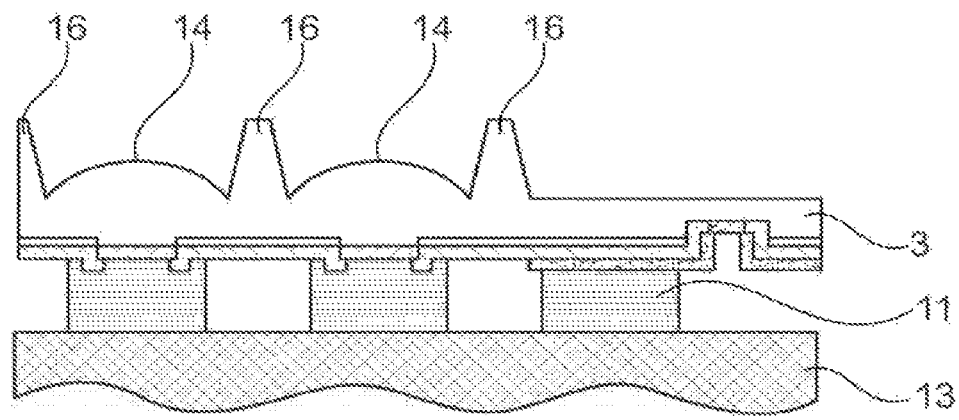
FIG. 13 represents a further alternative to the etching method where the matrix etching process forms GaN pillars according to an embodiment of the present invention.

FIG. 13 is a further alternative where in the matrix etching process, GaN pillars 16 are formed. As described in FIG. 10, pillars 16 can therefore be formed between the light extraction features (in this example lenses). This can be formed in the GaN at the same time as the light extraction features using standard techniques. Alternatively, the pillars 16 can be formed in the original substrate (description in FIG. 10) or they can be formed in the colour conversion substrate (described in FIG. 23). The pillars 16 will ideally have smooth surfaces and a highly reflective structure, irrespective of the technique.

Figure 14:
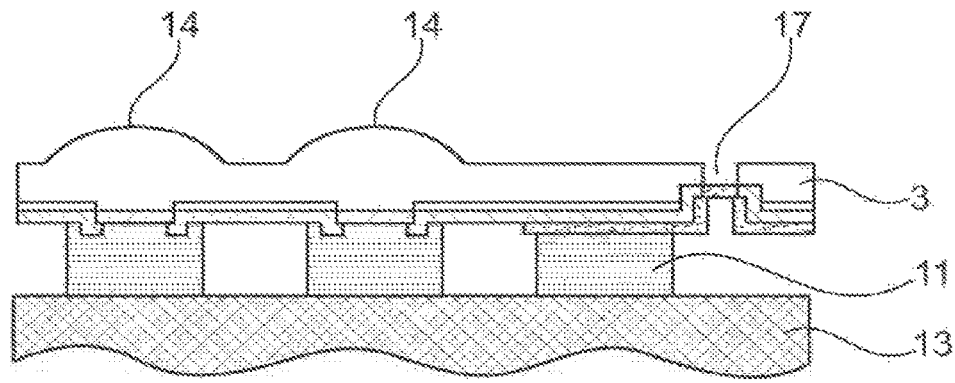
FIG. 14 represents a further alternative to the etching method where the GaN layer is etched through to form an etch to an n contact metal layer according to an embodiment of the present invention.

The process as shown in FIG. 14 then involves a further etching process where the GaN layer 3 is etched through to form an etched area 17 to the n contact metal layer 9 over the etched area 5. In this particular instance the light extraction feature (lens) and n opening can be simultaneously formed. The etching is performed by any suitable etching technique.

Figure 15:
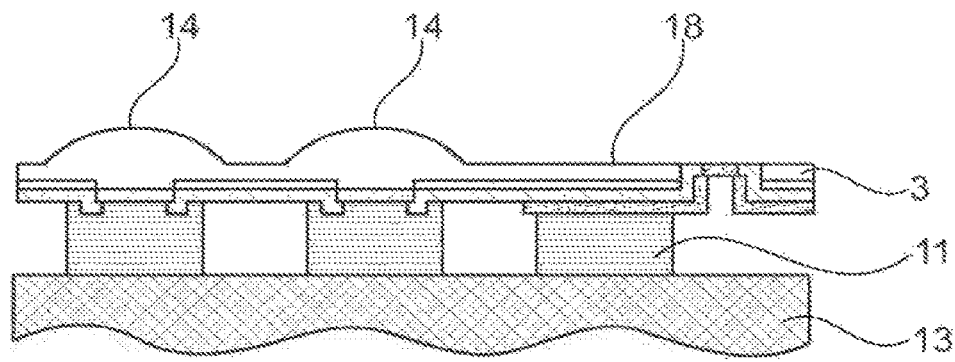
FIG. 15 represents a further alternative where the n contact layer is used as an etch stop to control the lens thickness according to an embodiment of the present invention.

FIG. 15 shown an alternative where the n contact layer 9 is used as an etch stop to control the lens thickness. The end point detection is used during the lens etch 18 to simultaneously open through to the n contact metal layer 9 and provide control of the lens thickness. As described in FIG. 9, the performed embodiment for the FIG. 14 process is that the n-contact can be used as an etch stop so as to accurately control the etch depth of the lens and thus its proximity to the QW layers.

Figure 16:
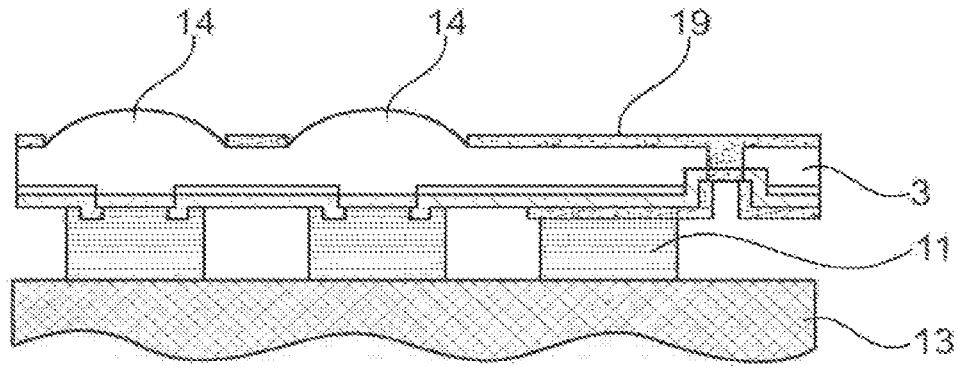
FIG. 16 represents a deposition step where there is a deposition of conductive metal grid and/or opaque layer according to an embodiment of the present invention.

FIG. 16 then shows that there is a deposition step where there is a deposition of conductive metal grid and/or opaque layer 19. This is similar to as described in FIG. 9 and the described ability to form a distributed electrical contact on the exposed GaN face. In this instance this forms an electrical bridge between the bond pad and the conductive GaN face. In this instance an opaque conductor is used. Consequently, this is not deposited over the light extraction features. The conductive metal grid and/or opaque layer 40 reduces bias and has a shielding effect.

Figure 17:
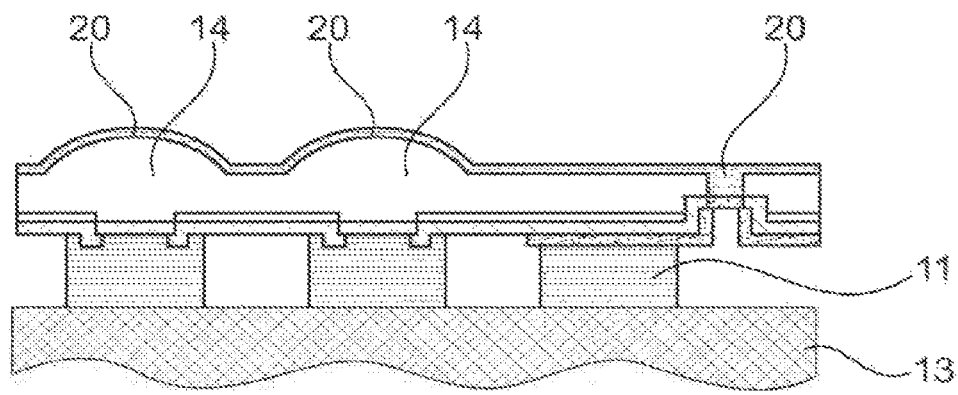
FIG. 17 represents an alternative deposition step where an ITO conductive layer is deposited instead of metal to create a transparent conductive layer according to an embodiment of the present invention.

FIG. 17 represents an alternative where an ITO conductive layer 20 is deposited instead of metal to create a transparent conductive layer 20. The selection of the appropriate ITO thickness may result in an anti-reflection coating. Like FIG. 16 a distributed n-contact can be formed. However, in this instance a transparent ITO layer can be deposited uniformly across the surface (can also be patterned so as not covering the light extraction feature). This can also be designed to have a thickness to reduce Fresnel reflections.

Figure 18:
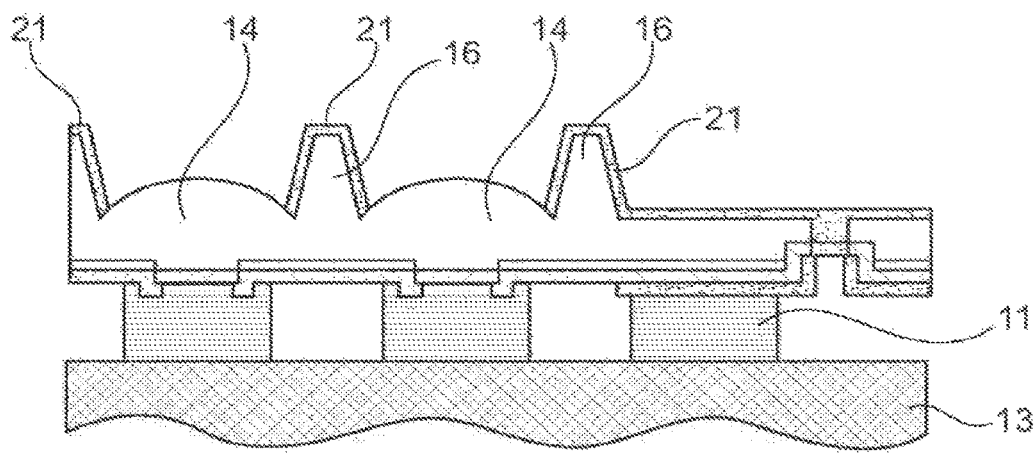
FIG. 18 represents a further alternative where GaN pillars are coated with a layer of n metal according to an embodiment of the present invention.

FIG. 18 is a further alternative where the GaN pillars 16 are coated with a layer 21 of n metal and may also cover the sidewalls to minimize crosstalk. This is a combination of FIGS. 10 and 17 where the metal can be patterned to provide distributed electrical contact and also provide reflective pillars.

Figure 19:
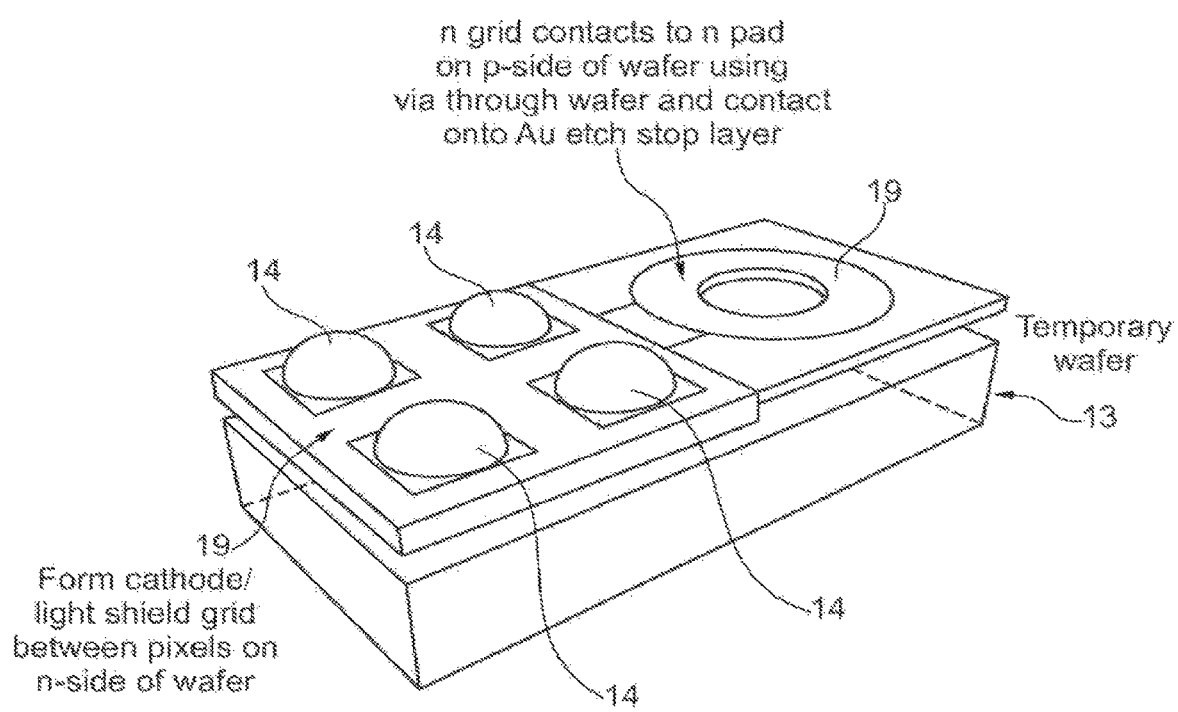
FIG. 19 is an upper perspective view of the device shown in FIG. 16 according to an embodiment of the present invention.

FIG. 19 is a schematic to illustrate the principle of forming light extraction features, an etch stop, distributed n contact and all bonded to a temporary carrier wafer such as silicon. This summarizes the completed GaN chip which can then be integrated to a backplane control substrate and a colour converting substrate.

Figure 20:
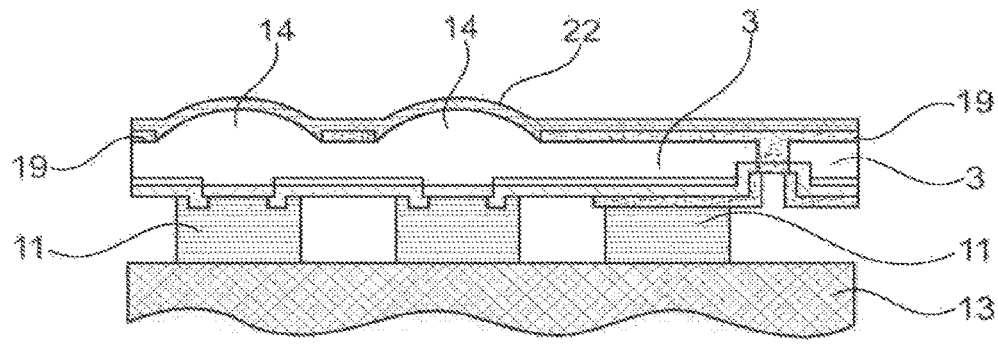
FIG. 20 represents the process where a layer of $SiO_2$ or any other suitable type of single or multi-layer coating is deposited over the surface of the GaN lens and the n metal layer according to an embodiment of the present invention.

In FIG. 20 a layer of $SiO_2$ or any other suitable type of single or multi-layer coating 22 may be deposited over the surface of the GaN lens 14 and the n metal layer 19. This provides both protection and an anti-reflection function.

Figure 21:
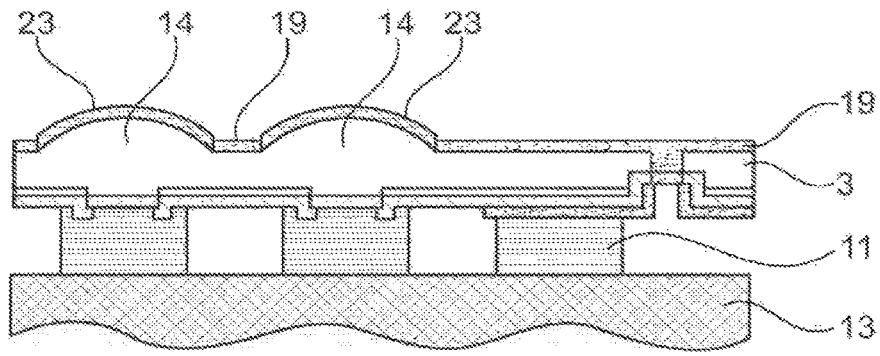
FIG. 21 represents a further alternative where only the curved area of the optical features are covered with a dielectric coating according to an embodiment of the present invention.

In FIG. 21 there is a further alternative where only the curved area of the optical features 14 (or roughened areas 15) are covered with a dielectric coating 23. Patterning is therefore only used to deposit over the light extraction area.

In FIG. 22 there is a further alternative where coatings 24a, 24b may be deposited. There may therefore be multi-layer dielectric coatings. There may simply be one coating or additional coatings or layers which have the function of providing a short pass wavelength filter function. The coatings 24a, 24b may be patterned to cover the optical features 14 only or it may cover the full surface. The short pass filter may be designed to allow blue light to exit the GaN but reflect longer wavelengths (i.e. the red or green light generated by the colour conversion layer). Like FIGS. 20 and 21 one of the great advantages of present technique is that many different layers can be deposited over the light extraction area. In this particular arrangement a short pass filter is employed. This efficiently transmits light in the pump wavelength region e.g. blue. It then reflects longer wavelength i.e. green and red so that the converted light which gets back to the GaN surface has a higher probability of exiting in the direction of the end-user.

Figure 23:
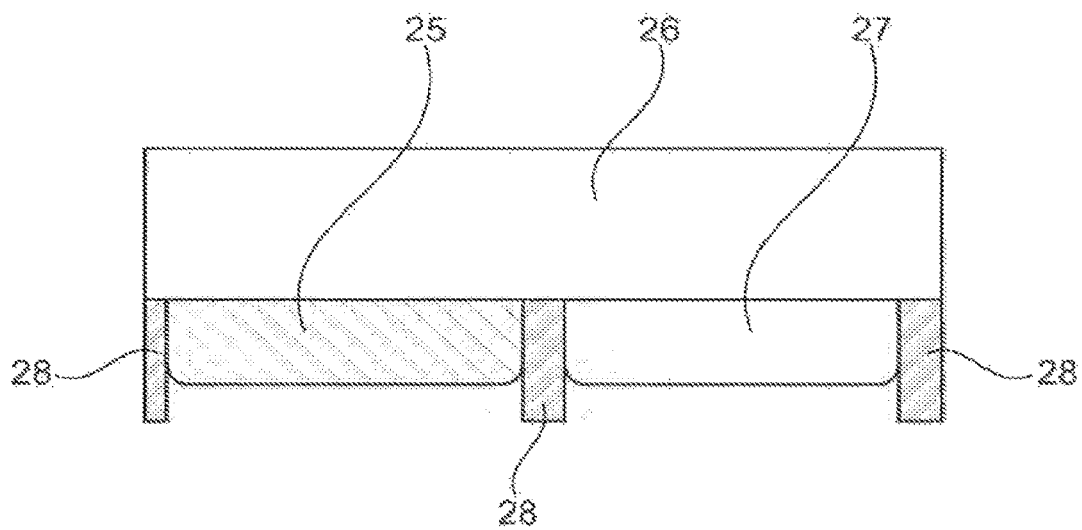
FIG. 23 represents a colour converter according to an embodiment of the present invention.

In FIG. 23 shows that now that the GaN layer has been prepared the next stage is to form a colour convertor region. The preferred route is to use a separate substrate as this provides enhanced flexibility, although colour convertors could be place on the GaN surface. In this case the colour convertor may be a phosphor, quantum dot, organic substance or a combination. The colour convertor substrate can be a range of materials such as glass, sapphire, silicone, etc. In this instance each colour convertor provides a sub-pixel and is optically pumped (blue-preferable or UV light). In the case a blue pump wavelength is used the blue sub-pixel has no colour convertor substance but may have a material to mimic the colour convertor so that is has similar emission properties e.g. beam divergence. In the event that each LED pump is UV then there is a colour convertor for red, green and blue. A matrix is also formed between the sub-pixels for improved contrast and to prevent light leakage into the adjacent pixel. This may be a black matrix or a reflective structure. Typically the matrix is formed on the colour conversion substrate. The colour conveyer comprises a colour conversion layer 25, a substrate 26, a transparent layer 27 and a mask 28. The substrate 26 may be made from glass, sapphire, silicon or any other suitable material.

Figure 24:
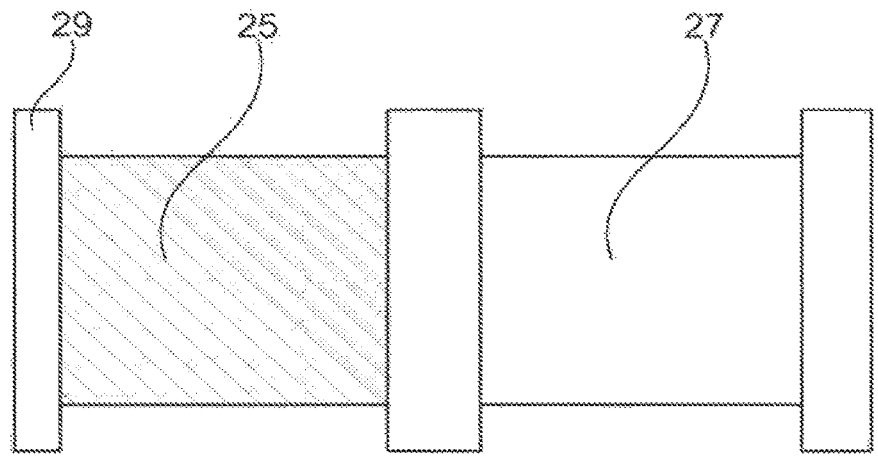
FIG. 24 represents an alternative colour converter where there is an etched silicon substrate according to an embodiment of the present invention.

FIG. 24 represents the option for forming the matrix for the colour converter region. In the event that the GaN on silicon substrate route is used, it is possible to easily polish and etch the silicon substrate (for other substrate such as sapphire or SiC this is a much more difficult process). Consequently, it is possible to etch a matrix into the silicon using wet or dry etching capabilities. Using either etching techniques can form matrices with high aspect ratio i.e. height to width of structure. The silicon will absorb light in the visible wavelength region, thus enhancing contrast. It is also possible to metallise the silicon matrix to provide reflection and enhance light conversion/output. The colour converter comprises a colour conversion layer 25, a transparent layer 27 and an etched silicon area 29.

Figure 25:
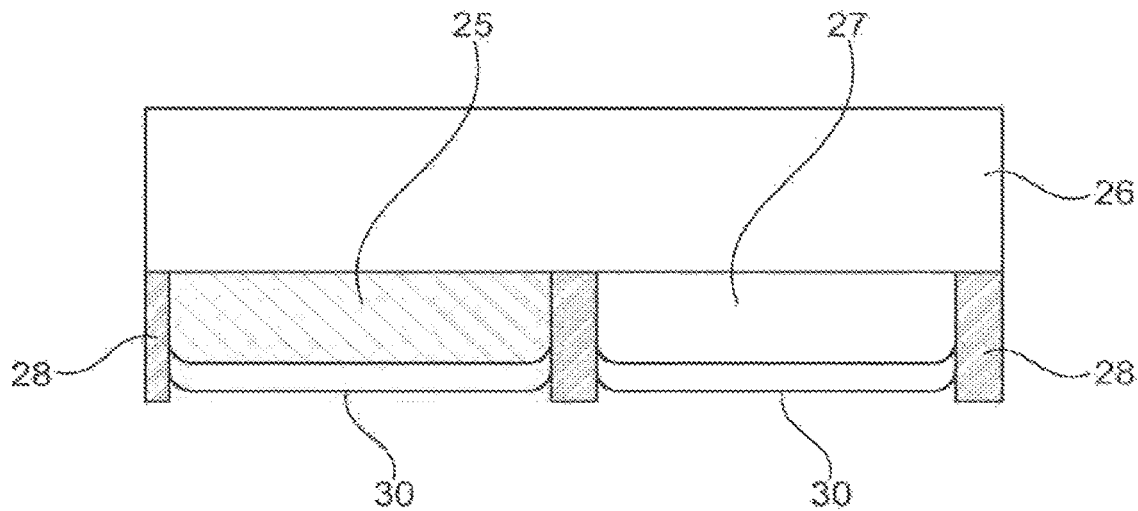
FIG. 25 represents a further alternative colour converter which is a short pass filter according to an embodiment of the present invention.

FIG. 25 is a further alternative colour converter. To enhance performance it is possible to include a filter on the colour converter layer. The short pass filter transmits light in blue and reflects at longer wavelengths i.e. green and red. For simplicity a multi-layer coating can be formed on all cells. Consequently, the light converted, which is isotropic in nature, is reflected and will exit in the intended direction. In the case of the blue emission pixel it may or may not be appropriate to have the filter. If pumping with UV light then the filter will be placed over all cells and have the properties of transmitting the UV pump but reflecting the longer wavelengths.

FIG. 26 is a further alternative colour converter which can be described as operating like a waveguide. As before there is a colour conversion layer 25, transparent layer 27 and a mask 28. In addition there are opaque/reflective features 33, a modified refractive index transparent layer 34 which provides an optical waveguiding function and an un-modified refractive index layer 35. For the colour converter transparent substrate (on which the colour convertors and matrix is formed), it is possible to modify the transparent layer 27. This can enable waveguides normal to the substrate plane to be formed. Consequently, the higher index layers will enhance optical waveguiding and enable the light to exit with a lower divergence. The index of the substrate can be modified as an example by laser induced effects to form the waveguide or can be formed by the etching and filling using higher index material. It is possible to use a transparent layer 34 of standard thickness of 0.5 to 2 mm. Furthermore, it is possible to use substrate layers 34 with thicknesses down to 20 μm.

FIG. 27 is a further alternative colour converter which can be described as a long pass filter. A further option/embodiment for the colour convertor transparent substrate is to also deposit a long pass filter, prior to the colour convertor being deposited on the substrate. This works in a similar fashion as FIG. 24 except in this arrangement the unconverted blue light is reflected back to the colour conversion region. The colour convertor is patterned so as not to cover the blue sub-pixel. The colour convertor has a long pass filter 31 located below the colour conversion layer 25. The long pass filter 31 allows converted light to exit, but recycles blue unconverted light. FIG. 27 also shows that a long pass filter 32 would not be deposited over blue pixels to allow transmission of blue light.

Figure 28:
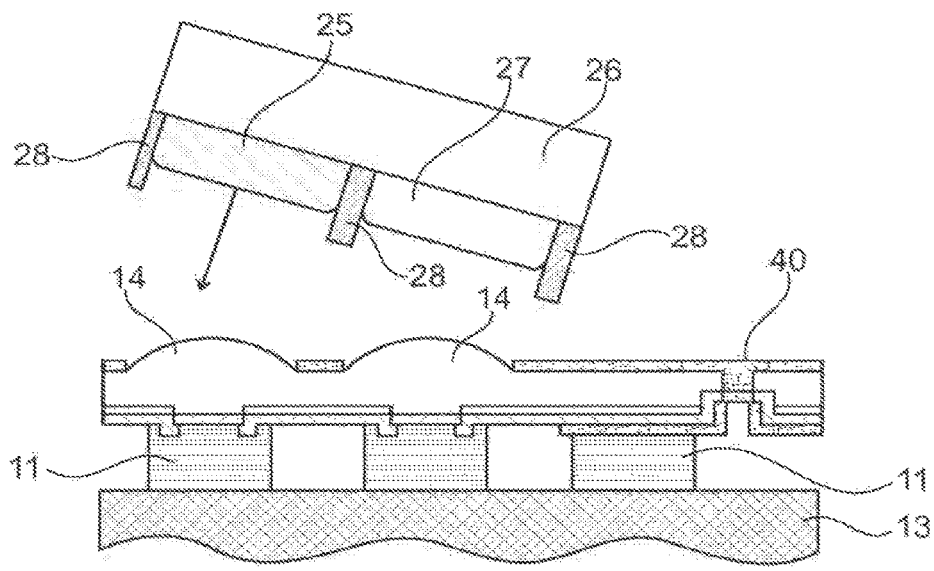
FIG. 28 represents the colour converter being brought up to and aligned with an LED layer according to an embodiment of the present invention.

In the next step shown in FIG. 28, a colour converter is brought up to and aligned with the LED layer. In this diagram the colour conversion layer is therefore aligned to the LED substrate. This is in preparation for bonding of the two structures and is completed in such a manner that the GaN sub-pixel LEDs are aligned to the respective colour conversion region.

Figure 29:
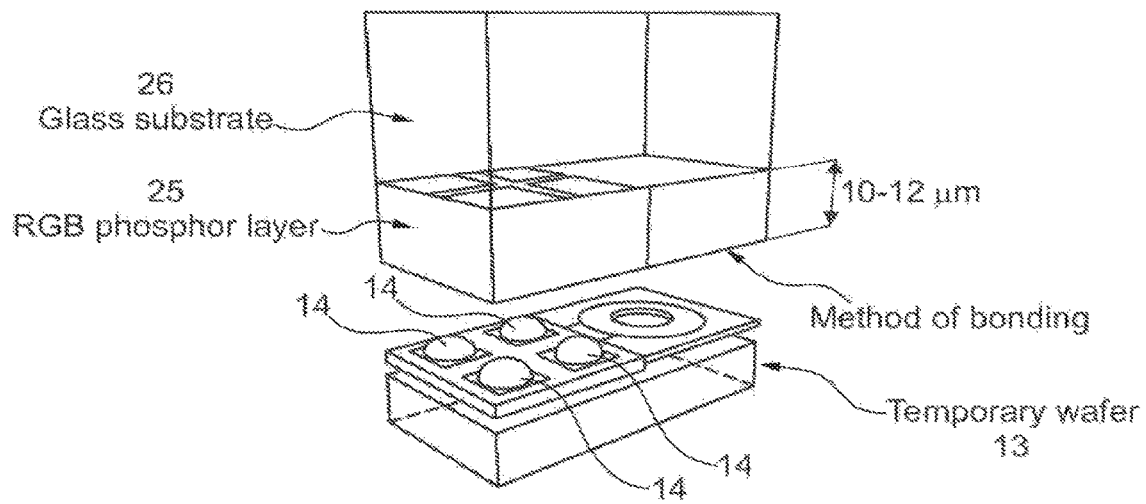
FIG. 29, represents a further view of the colour conversion layer being aligned above the rest of the LED layer.

In FIG. 29, there is a further view of the colour conversion layer being aligned above the rest of the LED layer. This is a schematic of FIG. 28. This highlights the transparent substrate for the colour conversion layer and the temporary wafer used to support the thin GaN LED layer.

Figure 30:
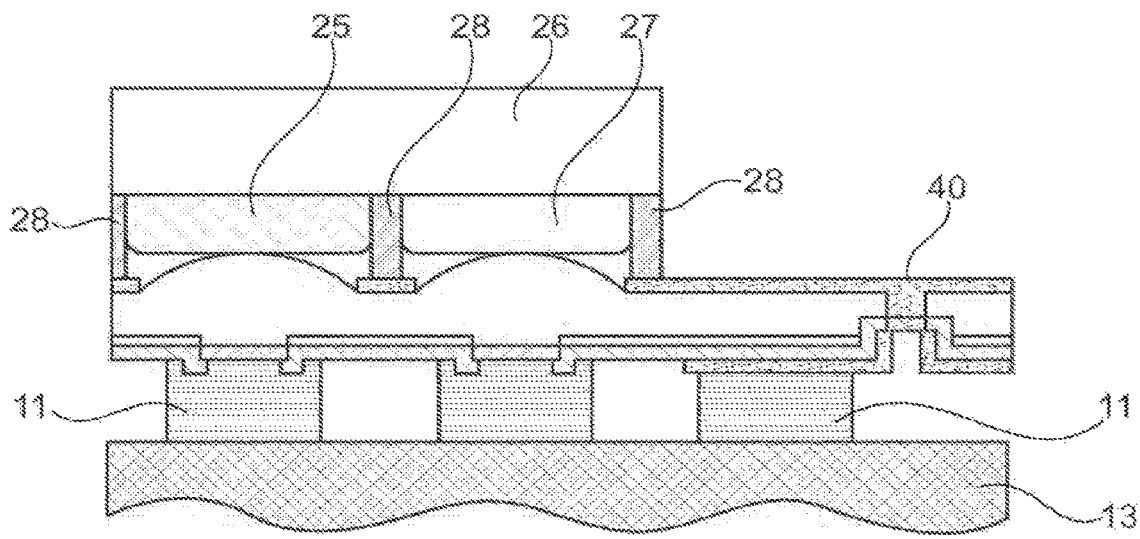
FIG. 30 represents a colour converter attached to the rest of the device according to an embodiment of the present invention.

In FIG. 30, the colour converter is attached to the rest of the device. Therefore, once suitable alignment has been completed the two layers are brought into contact and bonded together. As an example, this may be an epoxy type bonding process. It is also possible to perform this bond of the layer to provide a localised hermetic seal between the two substrates, thus providing enhanced protection to the colour conversion layer. In a preferred embodiment the colour converter is pumped with blue light and there is a red/green colour conversion layer which is the phosphor layer. Alternatively, the layer is a quantum dot or transparent/diffusing layer (blue) or a mixture thereof. FIG. 30 shows that extending vertically down from the glass substrate there are opaque/black mask or reflective masks 28. The reflective mask 28 is preferred as this has the ability to recirculate the light, minimises crosstalk and enhances display contrast. The reflective mask 28 therefore has the ability to transmit blue light and reflect red and green light when a filter is placed before the layer. In an alternative, if the filter is placed after the layer then the blue light will be recirculate and the red and green transmitted.

Figure 31:
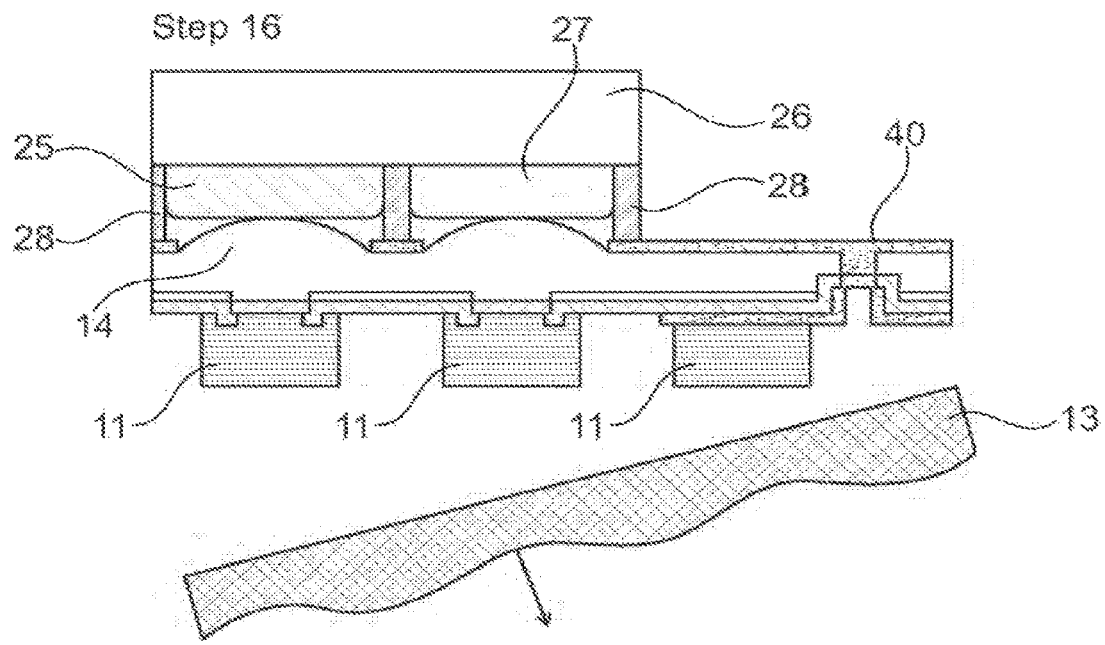
FIG. 31 represents a temporary layer being removed according to an embodiment of the present invention.

In FIG. 31, the temporary layer 13 is removed from the combined layers. This may be achieved by heating, solvent and or any other standard technique.

Figure 32:
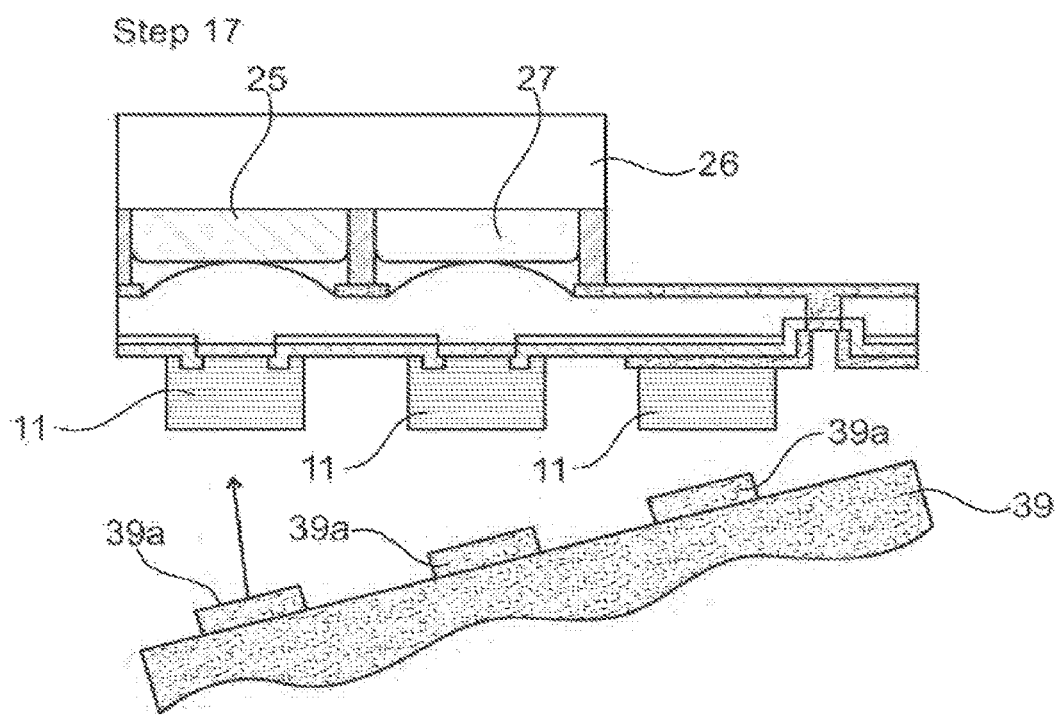
FIG. 32 represents an electric drive layer being brought up to and aligned with metal bond pads according to an embodiment of the present invention.

In FIG. 32, an electronic drive layer 39 is brought up to and aligned with the metal bond pads 11. The electronic drive layer 39 is a CMOS, TFT or NMOS layer. In the Figure this is showing the bond stack with topology for clarity. In the preferred embodiment the GaN modified LEDs can be used with a planarised surface. (FIG. 9 description is the way to provide a flat smooth surface). With no or little topology a range of different control backplanes can be bonded to the GaN surface including but not limited to CMOS, NMOS, TFT, etc.

Figure 33:
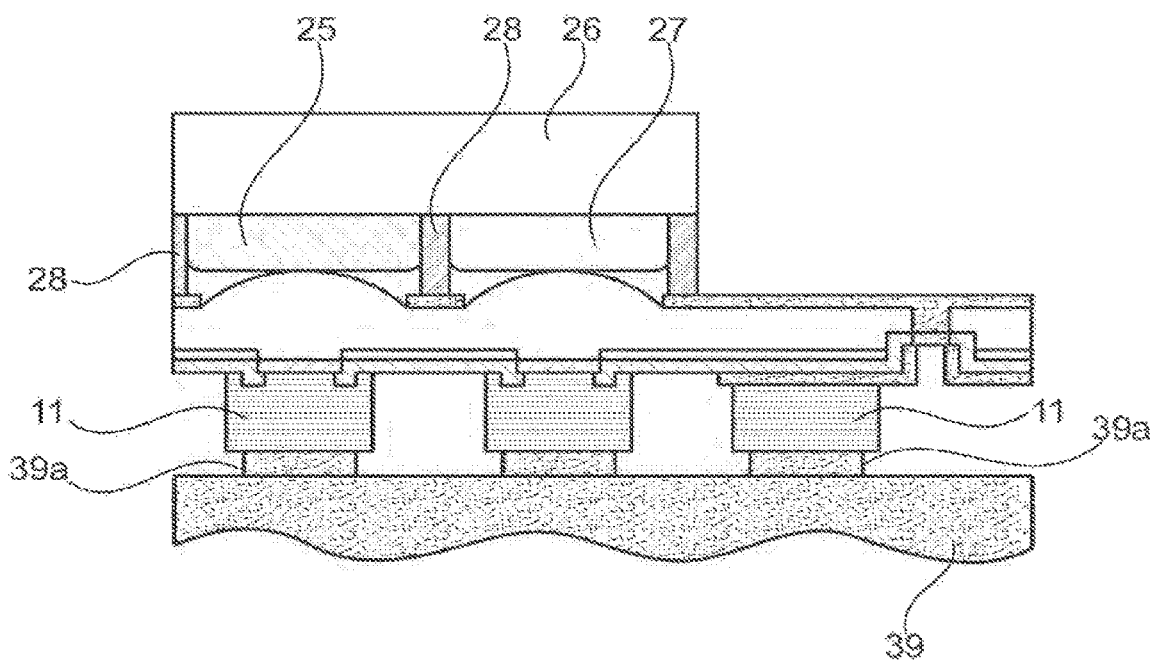
FIG. 33 represents metal bond pads being attached to the bond pads according to an embodiment of the present invention.

In FIG. 33 the metal bond pads 39a are attached to the bond pads 11. This is the completed micro-display structure highlighting many of the features necessary to provide display capability.

Figure 34:
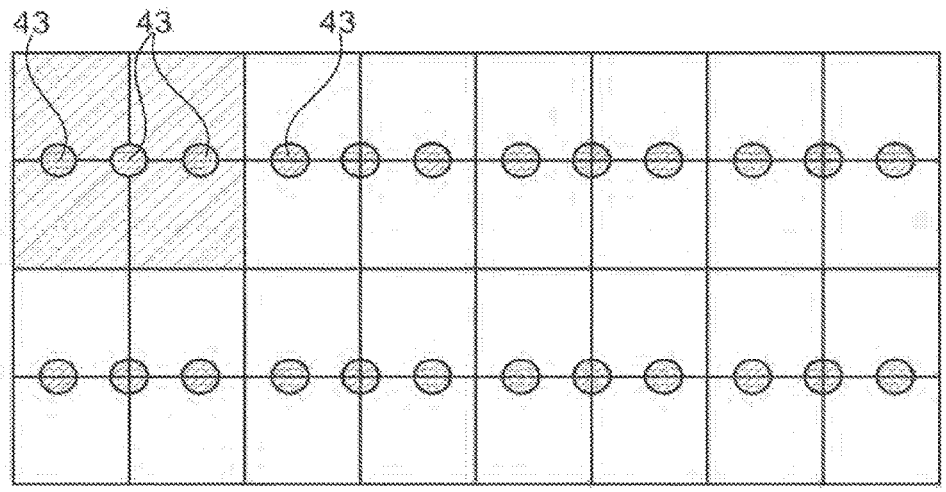
FIGS. 34 and 35 represent a plan view of pixel layout implementation according to an embodiment of the present invention.

FIG. 34 is a plan view of pixel layout implementation in layout A. In the embodiment shown the three sub-pixels 43 are arranged in a 20×20 micron cell. This highlights the possible layout of the GaN fed sub-pixels. In this particular configuration, three LEDs 43 are place within the, as an example, 20 μm×20 μm pixel region.

Figure 35:
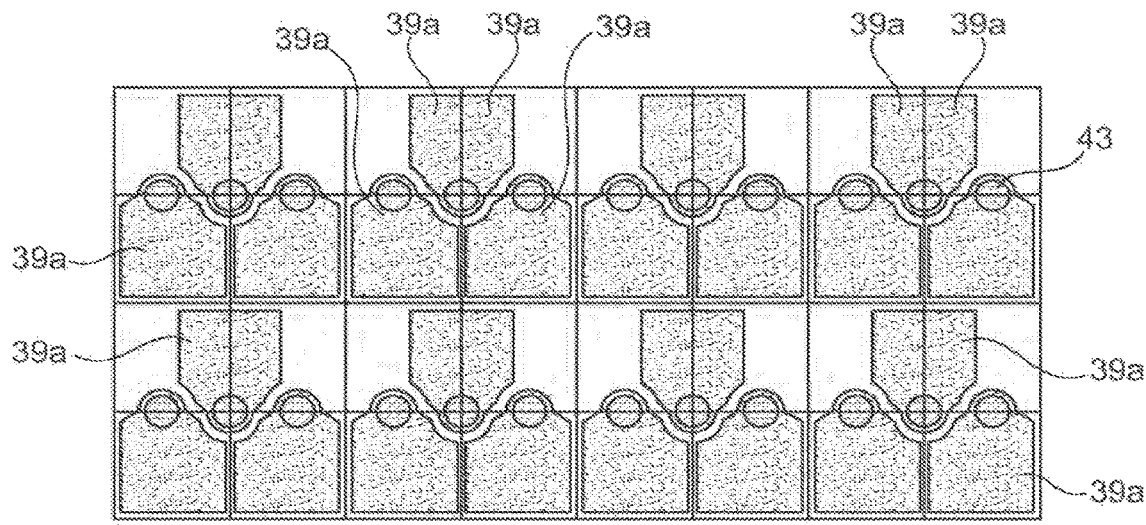

In FIG. 35 the bond pads 39a are shown as being positioned away from the pixels 43. The bond pads associated with each LED sub-pixel are in general larger. This can distribute the bond force and reduce the likelihood of physical damage. Furthermore, the resistance can be reduced by increasing the bond pad dimension. Using techniques such as GaN mod definition of the sub-pixel leads to improved performance as it reduces topology on the GaN surface and can provide LED sub-pixels with well-defined isolation layers.

Figure 36:
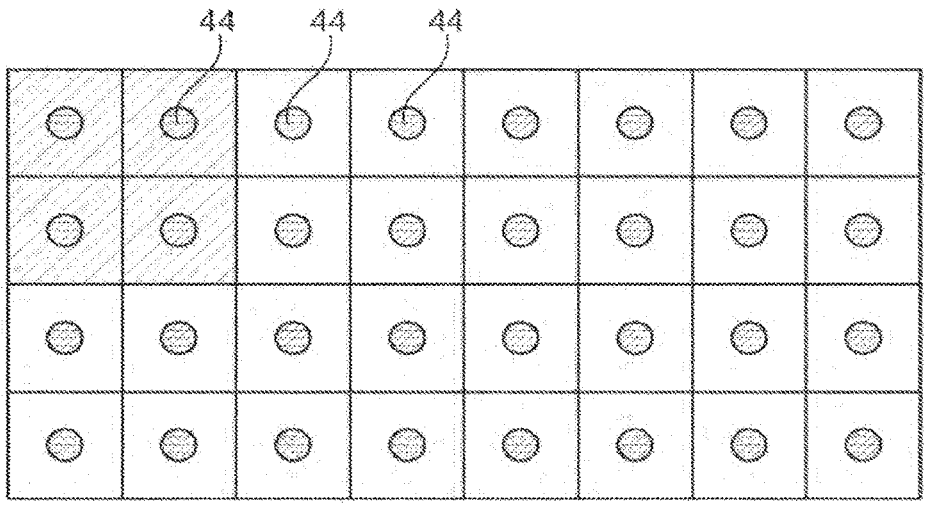
FIGS. 36 and 37 represents a plan view of a further pixel layout implementation according to an embodiment of the present invention.

FIG. 36 is a plan view of pixel layout implementation in layout B. In the embodiment shown there are four sub-pixels 44 included in each pixel. This is similar to FIG. 34 but in this instance four GaN led sub-pixels 44 are defined within the 20 μm×20 μm pixel region.

Figure 37:
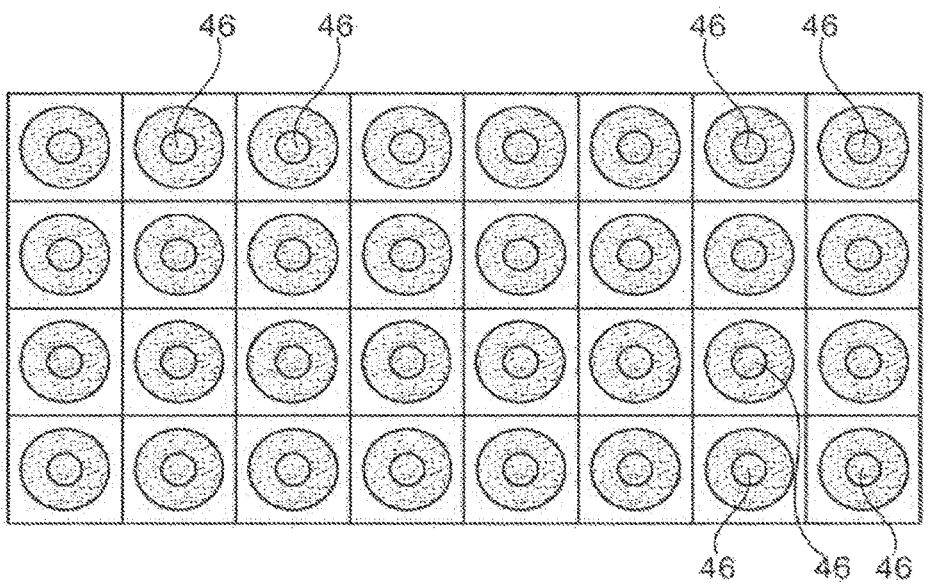

In FIG. 37 the bond pads 46 may be positioned over the pixel 44. This is similar to FIG. 35 with larger bond pads over each sub-pixel shown in FIG. 36.

Figure 38:
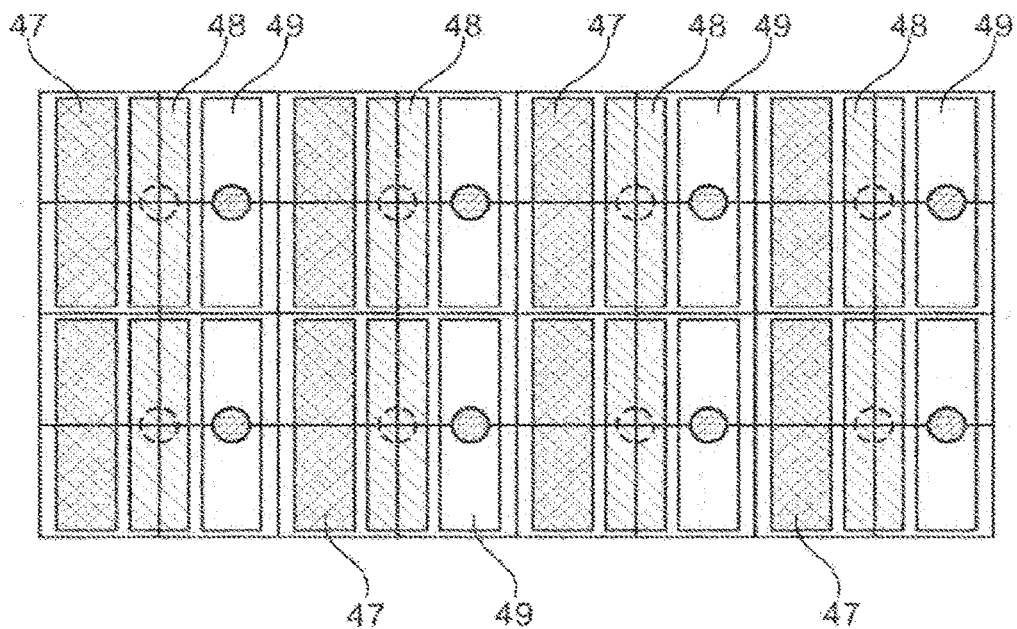
FIG. 38 represents a red colour conversion cell, a green colour conversion layer and a blue pixel without colour conversion cell according to an embodiment of the present invention.

In FIG. 38 there is a red colour conversion cell 47, a green colour conversion layer 48 and a blue pixel without colour conversion cell 49 (which may include a transparent/diffusing layer). This represents the layout of colour conversion layer in relation to sub-pixel layout in FIG. 34.

Figure 39:
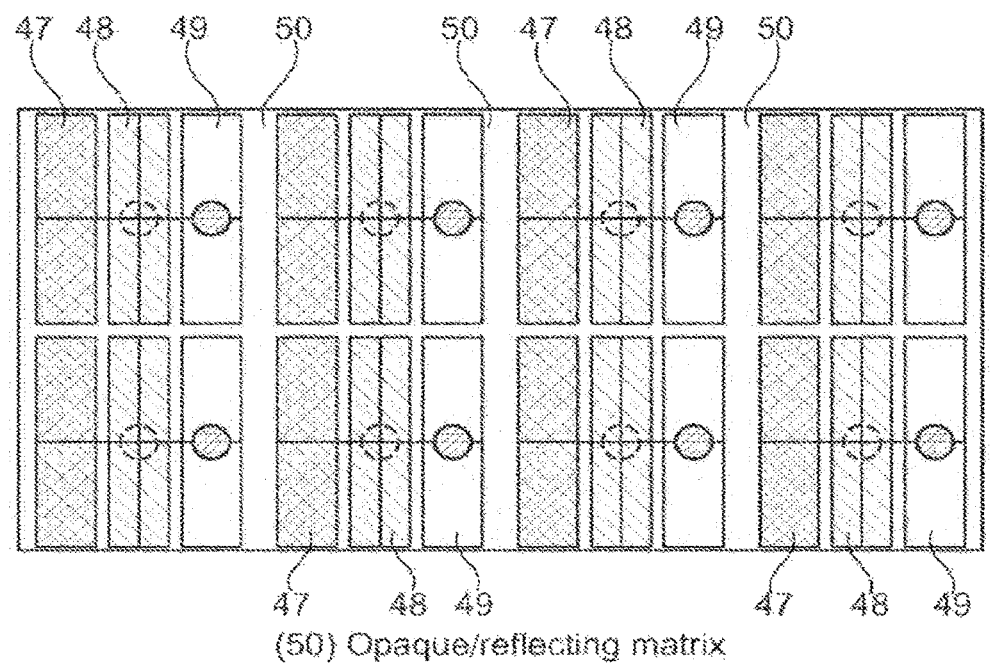
FIG. 39 represents a colour conversion cell where there is an opaque/reflecting matrix according to an embodiment of the present invention.

In FIG. 39 there is shown an opaque/reflecting matrix 50. This is similar to FIG. 38 also showing the matrix isolating each sub-pixel.

Figure 40:
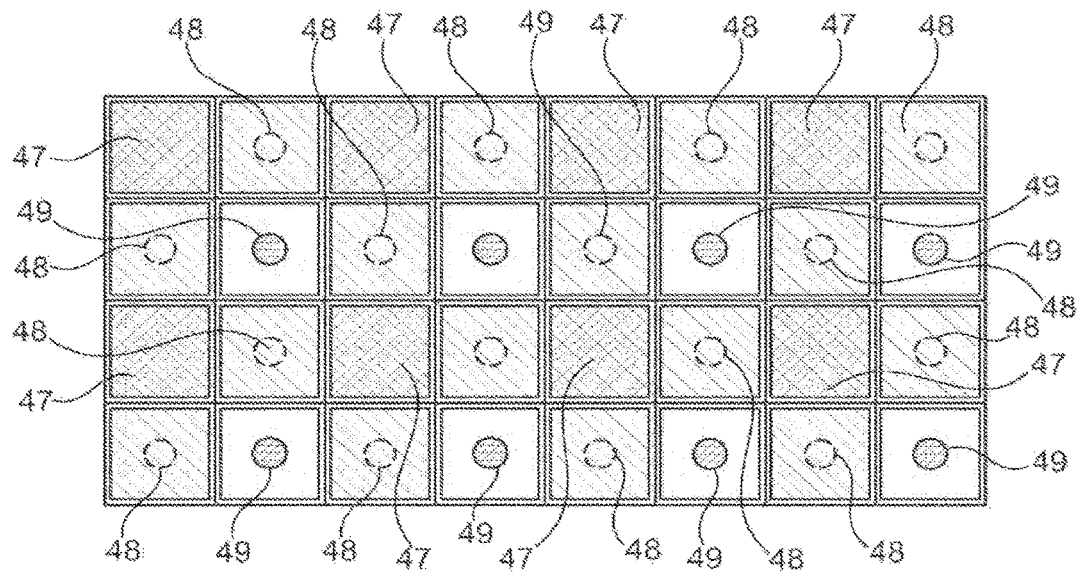
FIG. 40 represents a matrix of red colour conversion cells, green colour conversion cells and blue pixels without colour conversion cells according to an embodiment of the present invention.

In FIG. 40 there is a matrix of red colour conversion cells 47, green colour conversion cells 48 and blue pixels without colour conversion cells 49. This shows the layout of the colour conversion layer in relation to sub-pixel layout in FIG. 36.

Figure 41:
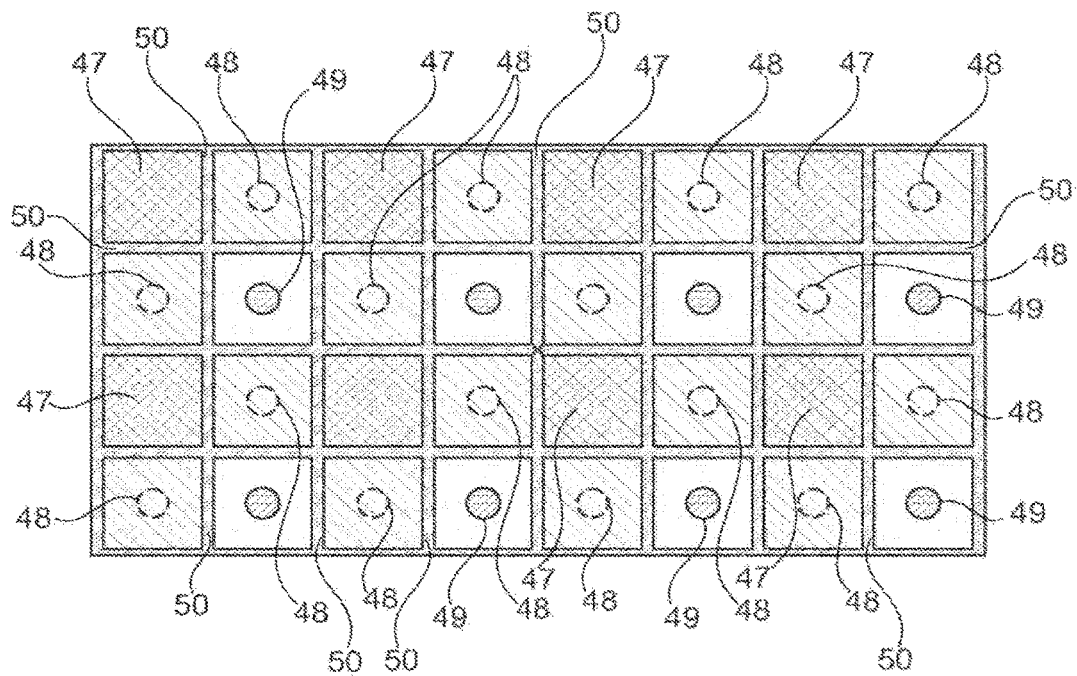
FIG. 41 represents a matrix of red colour conversion cells, green colour conversion cells, blue pixels without colour conversion cells and an opaque/reflecting matrix according to an embodiment of the present invention.

In FIG. 41 there is a matrix of red colour conversion cells 47, green colour conversion cells 48, blue pixels without colour conversion cells 49 and an opaque/reflecting matrix 50. This is similar to FIG. 40 and shows the matrix isolating each sub-pixel.

Whilst specific embodiments of the present invention have been described above, it will be appreciated that departures from the described embodiments may still fall within the scope of the present invention. For example, any suitable type of colour converter may be used and any suitable type of LED.

The invention claimed is:

1. An integrated light emitting diode (LED) micro-display, comprising:
    a color converter configured to change wavelength of light, the color converter including:
        a color conversion layer; and
        a long pass filter on the color conversion layer, wherein the long pass filter allows converted light by the color conversion layer to pass from the color conversion layer, and recycles unconverted light;
    a micro-LED array connected to the color converter, the LED array configured to form electrical connections and pump light into the color converter; and
    a backplane controller for the micro-LED array including an electronic drive layer, the color conversion layer of the color converter producing light at a longer wavelength than the pumped light from the micro-LED array.

2. The integrated LED micro-display of claim 1, wherein the color conversion layer is made from at least one of phosphor, quantum dot, or organic substance.

3. The integrated LED micro-display of claim 1, further comprising a substrate, and wherein the color conversion layer is on the substrate.

4. The integrated LED micro-display of claim 3, wherein the substrate is made from glass, sapphire, silicon, gallium nitride (GaN), or silicon carbide.

5. The integrated LED micro-display of claim 3, further comprising a transparent layer on the substrate.

6. The integrated LED micro-display of claim 5, further comprising a mask formed between the color conversion layer and the transparent layer, wherein the mask is opaque or reflective.

7. The integrated LED micro-display of claim 1, wherein the color converter further includes a short pass filter on a side of the color conversion layer opposite the long pass filter, the short pass filter transmits the pumped light from the micro-LED array to the color conversion layer and reflects the light at the longer wavelength.

8. The integrated LED micro-display of claim 1, where in the color converter further includes:
    a substrate having a first and second side;
    opaque/reflective features on the first side of the substrate;
    a modified refractive index transparent layer which provides an optical waveguiding function on the second side of the substrate; and
    an un-modified refractive index layer on the second side of the substrate.

9. An integrated light emitting diode (LED) micro-display comprising:
    a color converter configured to change wavelength of light, the color converter including:
        a modified refractive index layer;
        an un-modified refractive index layer; and
        a mask that is opaque or reflective positioned between the modified refractive index layer and un-modified refractive index layer; and
    a micro-LED array connected to the color converter, the micro-LED array configured to form electrical connections and pump the light into the color converter; and
    a backplane controller for the micro-LED array including an electronic drive layer, the color converter producing light at a longer wavelength than the pumped light from the micro-LED array.

10. The integrated LED micro-display of claim 9, wherein:
    the color converter further includes:
        a color conversion layer configured to produce the light at the longer wavelength than the light from the micro-LED array; and
        a transparent layer configured to transmit the light from the micro-LED array; and
    the modified refractive index layer and the un-modified refractive index layer are positioned to form a waveguide for the light produced by the color conversion layer and transmitted by the transparent layer.

11. The integrated LED micro-display of claim 10, wherein the mask is between the color conversion layer and the transparent layer.

12. The integrated LED micro-display of claim 10, wherein the color conversion layer is made from at least one of phosphor, quantum dot, or organic substance.

13. The integrated LED micro-display of claim 10, wherein the color converter further includes:
    a substrate including a first side and a second side, the modified refractive index transparent layer and the un-modified refractive index layer on the second side of the substrate; and
    opaque/reflective features on the first side of the substrate.

14. The integrated LED micro-display of claim 13, wherein the substrate is made from glass, sapphire, silicon, gallium nitride (GaN), or silicon carbide.

15. The integrated LED micro-display of claim 10, wherein the color converter further includes a short pass filter on the color conversion layer, the short pass filter transmits the light from the micro-LED array to the color conversion layer and reflects the light at the longer wavelength.

16. The integrated LED micro-display of claim 10, wherein the color converter further includes a long pass filter on the color conversion layer, the long pass filter allows converted light by the color conversion layer to pass from the color conversion layer, and recycles unconverted light.

17. An integrated light emitting diode (LED) micro-display comprising:
    a micro-LED array configured to generate light; and
    a color converter coupled to the micro-LED array, the color converter configured to change wavelength of the light, the color converter including:
        a color conversion layer positioned to receive first light from the micro-LED array and generate second light having a longer wavelength than the first light;
        a transparent layer positioned to receive third light from the micro-LED array and transmit the third light;
        a mask that is opaque or reflective positioned between the color conversion layer and the transparent layer; and
        a modified refractive index layer and an un-modified refractive index layer positioned to form a waveguide for the second light from the color conversion layer and the third light from the transparent layer.

18. The integrated LED micro-display of claim 17, wherein the color converter further includes:

a substrate including a first side and a second side, the modified refractive index transparent layer and the un-modified refractive index layer on the second side of the substrate; and opaque features on the first side of the substrate.

19. The integrated LED micro-display of claim 18, wherein the waveguide reduces divergence of light transmitted through the modified refractive index layer.

20. The integrated LED micro-display of claim 18, wherein the color converter further includes a short pass filter on the color conversion layer, the short pass filter transmits the first light from the micro-LED array to the color conversion layer and reflects the second light at the longer wavelength.

* * * * *

UNITED STATES PATENT AND TRADEMARK OFFICE
CERTIFICATE OF CORRECTION

PATENT NO. : 10,367,122 B2
APPLICATION NO. : 15/974581
DATED : July 30, 2019
INVENTOR(S) : Bonar et al.

Page 1 of 1

It is certified that error appears in the above-identified patent and that said Letters Patent is hereby corrected as shown below:

In the Claims

Column 15, Claim 8, Line 50, delete "where in" and insert -- wherein --, therefor.

Signed and Sealed this
Fourth Day of February, 2020

Andrei Iancu
*Director of the United States Patent and Trademark Office*